United States Patent
Tanabe

(10) Patent No.: US 7,924,037 B2
(45) Date of Patent: Apr. 12, 2011

(54) INSPECTION APPARATUS COMPRISING MEANS FOR REMOVING FLUX

(75) Inventor: Katsuhiro Tanabe, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/330,092

(22) Filed: Dec. 8, 2008

(65) Prior Publication Data

US 2009/0146674 A1    Jun. 11, 2009

(30) Foreign Application Priority Data

Dec. 7, 2007 (JP) ................................. 2007-316967
Jul. 18, 2008 (JP) ................................. 2008-186863

(51) Int. Cl.
*G01R 31/20* (2006.01)
(52) U.S. Cl. ............................. 324/754.12; 324/754.03
(58) Field of Classification Search .......... 324/754–765, 324/158.1, 754.12, 754.03
See application file for complete search history.

(56) References Cited

U.S. PATENT DOCUMENTS

| | | | | | |
|---|---|---|---|---|---|
| 4,875,005 | A | * | 10/1989 | Terada et al. ................. | 324/754 |
| 5,150,040 | A | * | 9/1992 | Byrnes et al. ................. | 324/758 |
| 5,434,512 | A | * | 7/1995 | Schwindt et al. ............. | 324/754 |
| 5,640,100 | A | * | 6/1997 | Yamagata et al. ............ | 324/754 |
| 5,835,997 | A | * | 11/1998 | Yassine ......................... | 324/754 |
| 6,037,793 | A | * | 3/2000 | Miyazawa et al. ............ | 324/760 |
| 6,114,869 | A | * | 9/2000 | Williams et al. .............. | 324/765 |
| 6,194,907 | B1 | * | 2/2001 | Kanao et al. .................. | 324/760 |
| 6,239,590 | B1 | * | 5/2001 | Krivy et al. .................. | 324/158.1 |
| 6,356,093 | B2 | * | 3/2002 | Nishikawa et al. ........... | 324/758 |
| 6,411,079 | B1 | * | 6/2002 | Nishikawa .................... | 324/158.1 |
| 6,744,268 | B2 | * | 6/2004 | Hollman ....................... | 324/758 |
| 6,747,447 | B2 | * | 6/2004 | Markert et al. ............... | 324/158.1 |
| 7,119,566 | B2 | * | 10/2006 | Kim ............................... | 324/758 |
| 7,161,347 | B1 | * | 1/2007 | Miller et al. .................. | 324/158.1 |
| 7,221,176 | B2 | * | 5/2007 | Yoshioka et al. ............. | 324/758 |
| 7,443,157 | B2 | * | 10/2008 | Zhang et al. .................. | 324/158.1 |
| 7,477,064 | B2 | * | 1/2009 | Kurihara et al. .............. | 324/758 |
| 2003/0080763 | A1 | * | 5/2003 | Yu et al. ........................ | 324/758 |
| 2008/0315904 | A1 | * | 12/2008 | Ishii ............................... | 324/758 |

FOREIGN PATENT DOCUMENTS

| | | |
|---|---|---|
| JP | 2002-90386 | 3/2002 |
| JP | 2002-288001 | 10/2002 |

* cited by examiner

*Primary Examiner* — Ha Tran T Nguyen
*Assistant Examiner* — Richard Isla Rodas
(74) *Attorney, Agent, or Firm* — Cooper & Dunham LLP

(57) ABSTRACT

An inspection apparatus includes an electrical connection member which is configured to remove flux attached to a part to be inspected of an object to be inspected, a base member which is provided with the electrical connection member, a driving member which is configured to move the base member relative to the object to be inspected, a control member which is configured to control an operation of the driving member, and an inspection start-up member which is configured to send an operation start signal to the control member, when the operation start signal is sent from the inspection start-up member to the control member, the base member is moved by the driving member, and the electrical connection member is brought into contact with the part to be inspected of the object to be inspected a predetermined number of times, by a control of the control member.

17 Claims, 22 Drawing Sheets

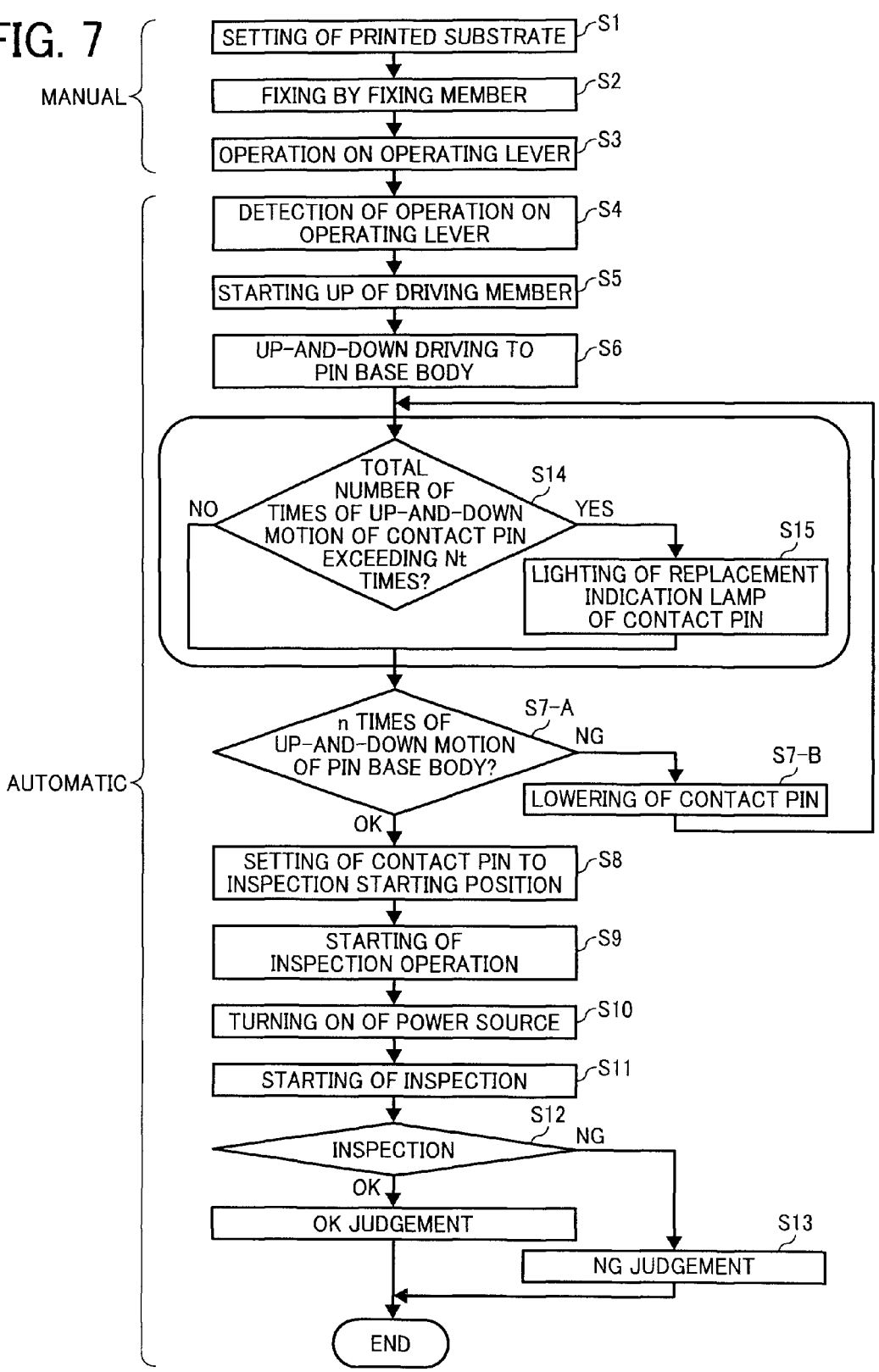

INSPECTION APPARATUS COMPRISING MEANS FOR REMOVING FLUX

BACKGROUND OF THE INVENTION

1. Technical Field

This disclosure relates to an inspection apparatus, by which flux attached to a part of an object to be inspected is removed, and an electrical connection member is brought into contact with the part to be inspected. Thus, reliable inspection of the object can be performed.

2. Description of the Related Art

Conventionally, for electrical inspection of a printed substrate which has electronic parts mounted thereon, an inspection apparatus which has a contact pin of a contact type forming its end shape is often used. The contact pin, for example, is formed from an electrical conducting material, and a sharp needle which forms the end shape of the contact pin is stored in a sleeve, and the contact pin is biased by a spring to be moved toward an object to be inspected.

In the inspection apparatus, a plurality of contact pins are arranged corresponding to parts to be inspected of the printed substrate, for example, electrode parts or lead soldered portions of the electronic parts, etc. And when carrying out the inspection, a flux film formed on a surface of the substrate during processing, such as a reflow process, is broken through and removed by pressing a needle end of each of the plurality of contact pins against the printed substrate, and then the needle end is brought into contact with the respective part to be inspected, and electrical connection is achieved. And thus, detection of, such as defects of the soldered portions, or damage of the electrical parts, or unmounted parts, is carried out by processing electric signals obtained by the contact pins with an electric circuit in the inspection apparatus.

JP 2002-90386 A proposes a structure of a contact pin to reliably remove a flux film attached to a printed substrate.

In the conventional inspection which employs the contact pin, if the flux is not removed with the contact pin, an inspection error occurs due to defective conduction. In addition, when the flux attaches or accumulates at the end part of the needle when repeating the inspection, or the flux film is not removed completely due to variability of a thickness of the flux film, etc., defective conduction is caused between the contact pins and the parts to be inspected. Therefore, in the inspection operation, the inspection begins after moving the contact pins to the object to be inspected and removing the flux.

The contact pin described in JP 2002-90386 A is structured such that, to remove the flux reliably, a needle stored in a sleeve is movable axially, first and second springs, a supporting member, an inclining member which maintains a leaning posture, a third spring and a receiving member are arranged at the needle, and when pressing an end of the needle against the printed substrate, the inclining member moves with an operation of the needle and is guided by an inner wall surface of the sleeve to be in a vertical posture, and under such a condition, a pin provided on the inclining member in a protruding condition is inserted into a hole of the receiving member by the second spring, and the members collide mutually through the closely-attached third spring, and the impact strength is added to the needle.

For the contact pin described in JP 2002-90386 A, due to a movable structure which includes a plurality of members being provided in the pin, problems arise such as, for example, an increase of the manufacturing cost, variability of product features and occurrence of defective behavior due to the complexity of the structure.

In addition, in the conventional inspection process, for example, as illustrated in a flow chart of FIG. 22, an operator sets the printed substrate which is the object to be inspected to a predetermined position (S101), by moving the contact pin from a standby position to come into contact with the printed substrate (S102), the flux attached to the part to be inspected is removed (S103), and when it is determined that the flux is satisfactorily removed for an inspection (OK of S103), the predetermined inspection is started in a state where the contact pin comes into contact with the printed substrate (S104).

When an inspection operation is started in step S104, a power source of the inspection apparatus is turned on (S106), and an electrical inspection on the printed substrate is started (S107), and by an inspection judgment (S108), judgments of a good item (OK) and a defective item (NG) are made (S109). Processes of steps S106-S109 are carried out automatically by control judgments of a computer, for example.

However, when the operator judges that the flux is not removed completely (No of S103), the contact pin is moved away from the part to be inspected (S105), and again the contact pin is moved from the standby position to come into contact with the printed substrate (S102), and after the flux attached to the part to be inspected is removed (S103), the inspection processes after step S104 are carried out.

The processes of S101-S105 are performed by manual operations of the operator, and it is necessary to move the contact pin up and down many times to remove the flux reliably, depending on a state of the flux. Therefore, a problem arises in that the inspection takes more time, i.e., a time for removal of the flux.

BRIEF SUMMARY

In an aspect of this disclosure, there is provided an inspection apparatus, by which flux attached to a part to be inspected is removed automatically, easily and reliably when inspecting, and good workability can be obtained, and the part to be inspected is in a good state.

In another aspect of this disclosure, there is provided an inspection apparatus including: an electrical connection member which is configured to remove flux attached to a part to be inspected of an object to be inspected; a base member which is provided with the electrical connection member; a driving member which is configured to move the base member relative to the object to be inspected; a control member which is configured to control an operation of the driving member; and an inspection start-up member which is configured to send an operation start signal to the control member, when the operation start signal is sent from the inspection start-up member to the control member, the base member is moved by the driving member, and the electrical connection member is brought into contact with the part to be inspected of the object to be inspected a predetermined number of times, by control of the control member.

BRIEF DESCRIPTION OF THE DRAWINGS

The above and other aspects, features and advantages will be described further below with reference to exemplary embodiments and the accompanying schematic drawings, in which:

FIG. 7 illustrates a flow chart which includes a process for informing when the time for replacement of the contact pin has been reached, according to the embodiment of the present invention;

DETAILED DESCRIPTION OF THE PREFERRED EMBODIMENTS

Figure 1:
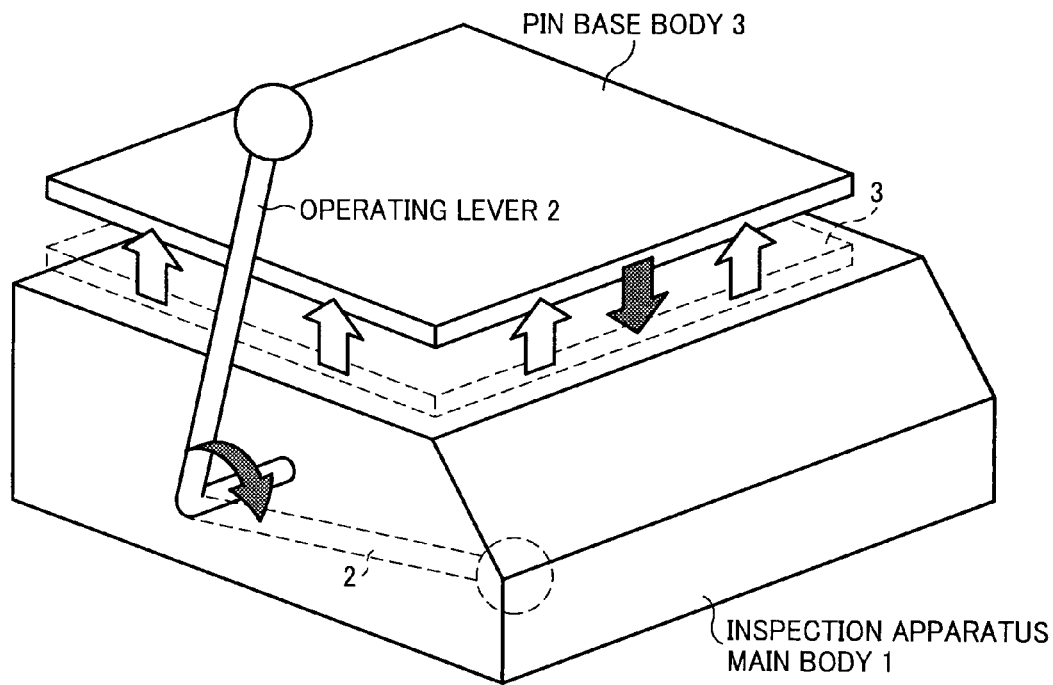
FIG. 1 is a perspective view illustrating an embodiment of an inspection apparatus according to the present invention.
Figure 2:
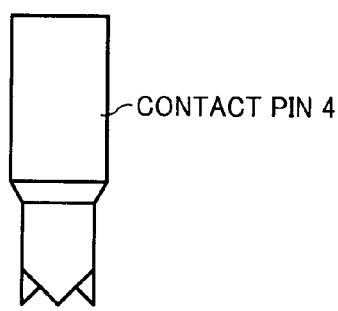
FIG. 2 illustrates a main part of a contact pin used in the embodiment of the inspection apparatus according to the present invention.

FIG. 1 is a perspective view illustrating an embodiment of an inspection apparatus according to the present invention. In FIG. 1, 1 represents an inspection apparatus main body, 2 represents an operating lever which works as an inspection starting member and is arranged at a side part of the inspection apparatus main body 1, and 3 represents a pin base body which is provided with a plurality of contact pins 4 and is a base member capable of moving. Each of the plurality of contact pins 4 is formed from an electrical conducting material and includes a sharp needle shape at its leading end, as an electrical connection member, as illustrated in FIG. 2.

As illustrated in FIGS. 3A-3D, the inspection apparatus main body 1 is provided with a fixing member 6, the fixing member 6 includes a chucking part to maintain and fix a printed substrate 5 as an object to be inspected to a predetermined inspection position (for example, an inspection starting position), and the pin base body 3 is disposed downward of the fixing member 6. A driving member 7 which moves the pin base body 3 relative to the printed substrate 5 is provided in the inspection apparatus main body 1. In addition, a control member 8, which receives a sensing signal of such as a sensor that monitors an operating condition of the operating lever 2, and controls each part including the driving member 7, is provided in the inspection apparatus main body 1.

Figure 4A:
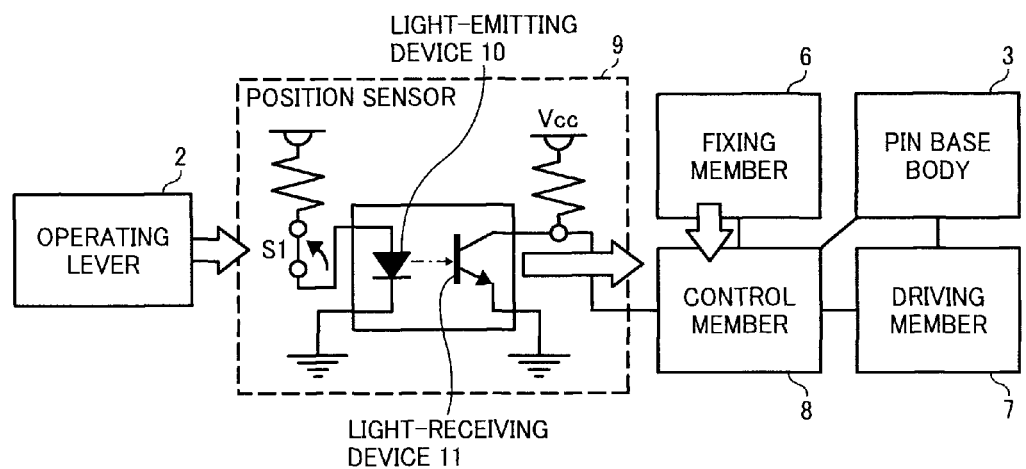
FIGS. 4A-4D illustrate a detailed structure and relationships of each part of the embodiment of the inspection apparatus according to the present invention.

As illustrated in FIG. 4A, a position sensor 9 which is configured to monitor the operating condition of the operating lever 2, includes a light-emitting device 10 and a light-receiving device 11 arranged in an operation area of the operating lever 2. The position sensor 9 detects an initial rotation of the operating lever 2, and outputs the sensing signal to the control member 8.

Figure 4B:
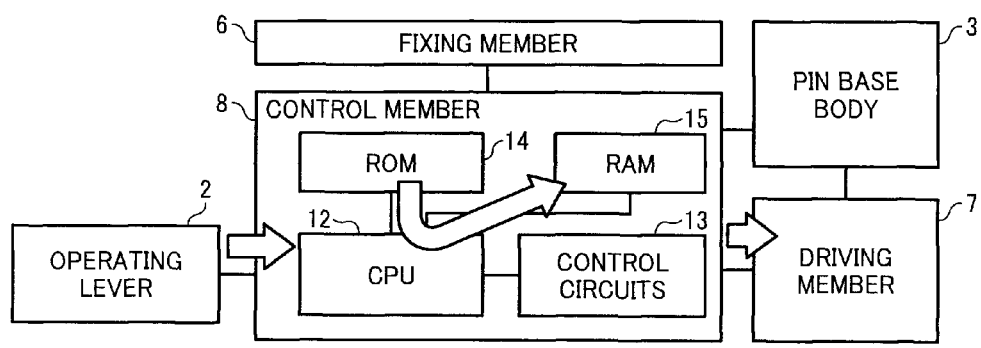

As illustrated in FIG. 4B, the control material 8 includes a CPU (central processing unit) 12, various control circuits 13, and a ROM 14 and a RAM 15, each of which is a memory device.

Figure 4C:
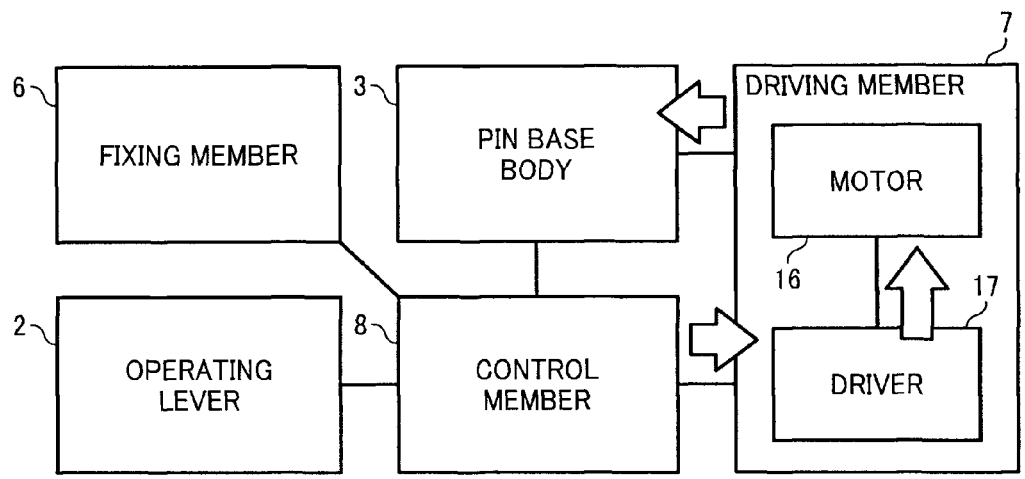

As illustrated in FIG. 4C, the driving member 7 includes a motor 16 and a motor driver 17. The motor 16 is a driving source which moves the pin base body 3, and the motor driver 17 receives a control by the control member 8.

Figure 4D:
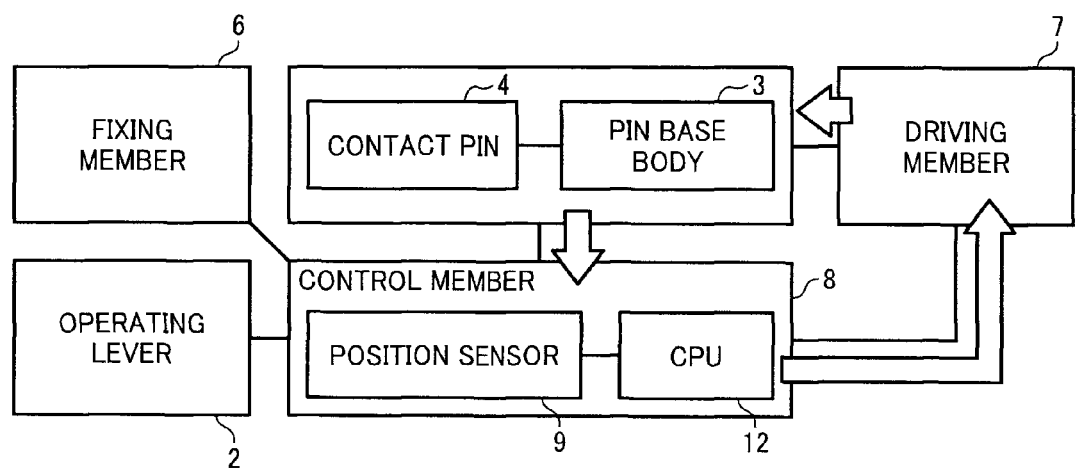

As illustrated in FIG. 4D, the electrical connection member includes the pin base body 3 which is provided with the plurality of contact pins 4, and is driven by the driving member 7, which receives a command signal of the control member 8.

Next, referring to FIGS. 3A-3D, FIGS. 4A-4D, and a flow chart illustrated in FIG. 5, an inspection in the embodiment will be explained.

Figure 3A:
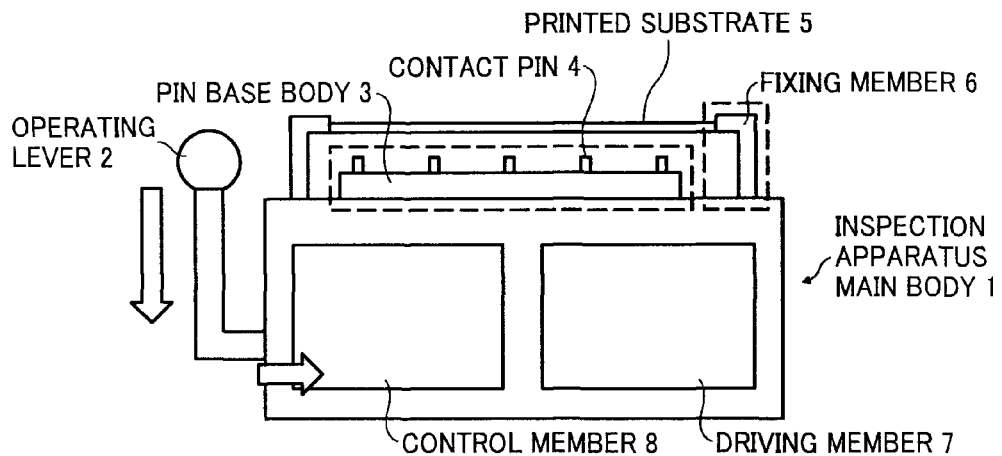
FIGS. 3A-3D illustrate a schematic structure and relationships of each part of the embodiment of the inspection apparatus according to the present invention.

First, as illustrated in FIG. 3A, an operator sets the printed substrate 5 as the object to be inspected to a predetermined position (S1), and the printed substrate 5 is maintained and fixed by the fixing member 6 (S2). Afterwards, the operating lever 2 is turned by the operator (S3). Up until here, all the operations are carried out manually by the operator.

As illustrated in FIG. 4A, the operation on the operating lever 2 is detected by light interception/transmission detection of the light-emitting device 10 and the light-receiving device 11 of the position sensor 9, and the sensing signal is output to the CPU 12 of the control member 8 (S4).

Figure 3B:
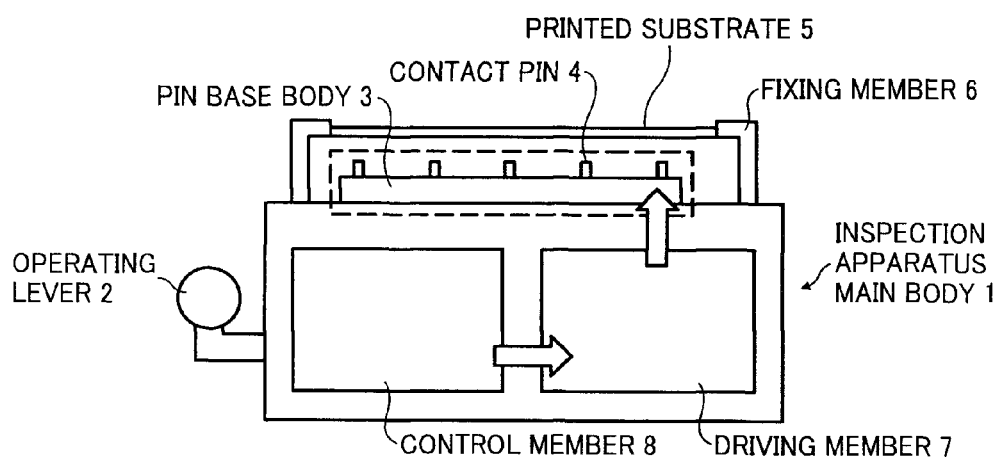
Figure 3C:
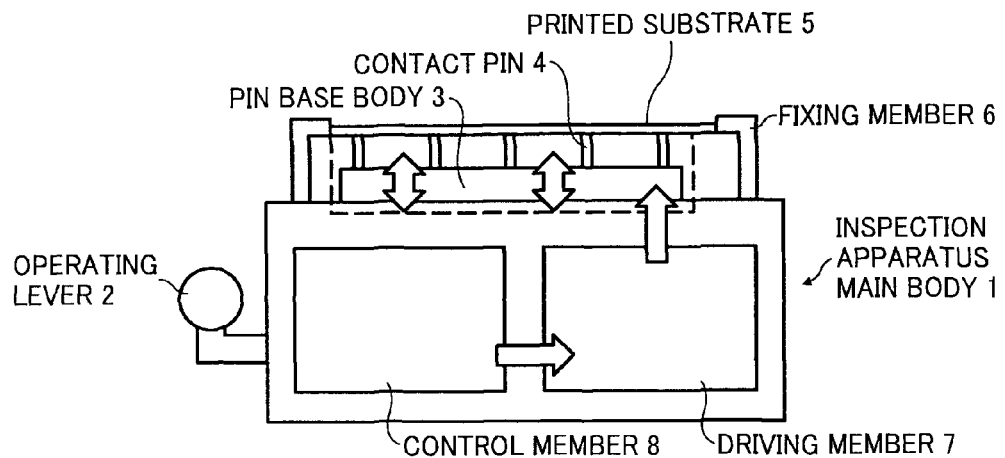

As illustrated in FIGS. 3B and 4B, a driving signal is sent from the CPU 12 to the driving member 7, the motor driver 17 is turned on and the motor 16 is started up (S5), and as illustrated in FIGS. 3C and 4C, the pin base body 3 is raised, and the contact pins 4 are brought into contact with the printed substrate 5, and flux that adheres to a part to be inspected is removed (S6). The CPU 12 is configured to perform a control that moves the pin base body 3 up and down a predetermined number of times (S7-A and S7-B), to remove the flux reliably.

Figure 3D:
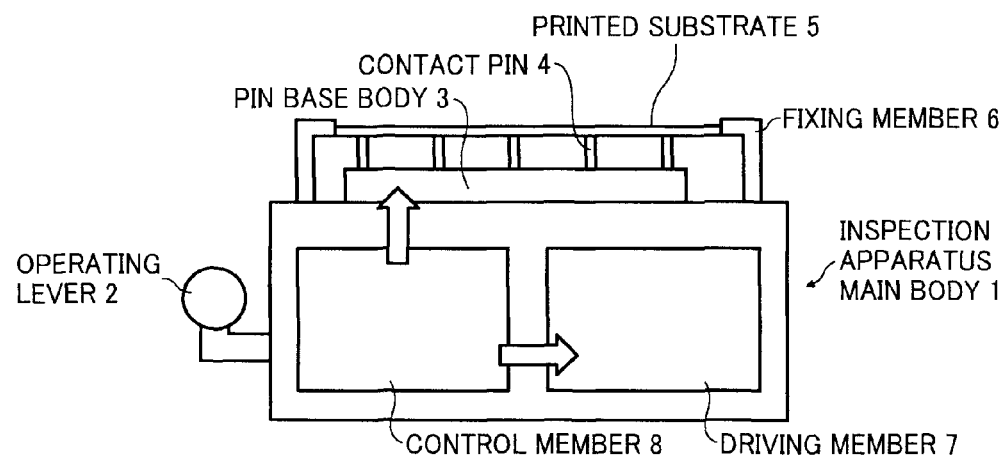

Afterwards, as illustrated in FIGS. 3D and 4D, the driving member 7 is operated to move the pin base body 3, and the contact pins 4 are set to the inspection starting position (S8), and an inspection operation on the printed substrate 5 is started (S9), by a control from the CPU 12. At this time, the CPU 12 executes a check program stored in the ROM 14, a power source of an inspection part is turned on (S10), and an inspection is started (S1), and by an inspection judgment (S12), judgments of a good item (OK) and a defective item (NG) are made (S13), and then a judgment signal is output.

Figure 5:
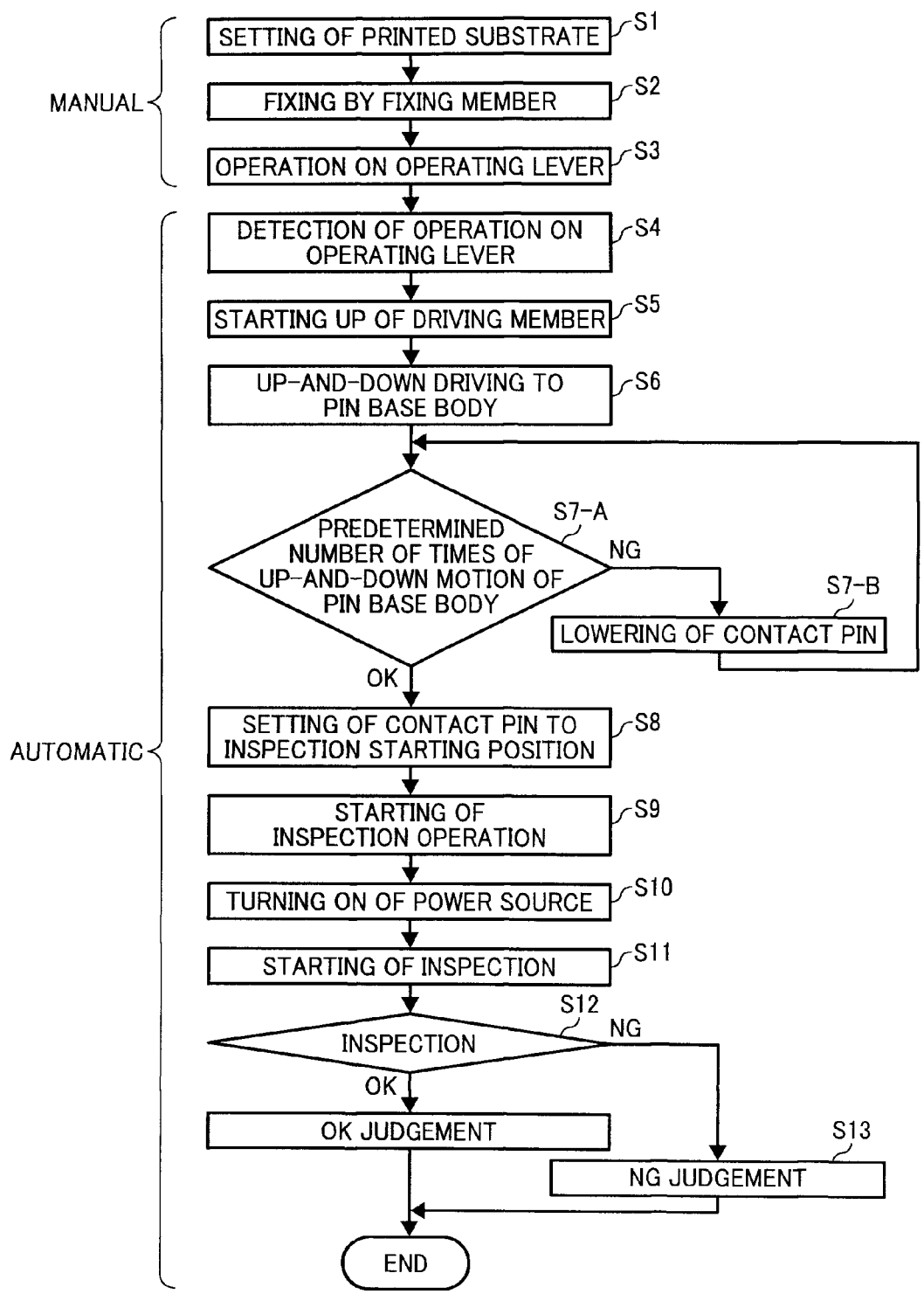
FIG. 5 is a flowchart illustrating an inspection process according to the embodiment of the present invention.
Figure 6A:
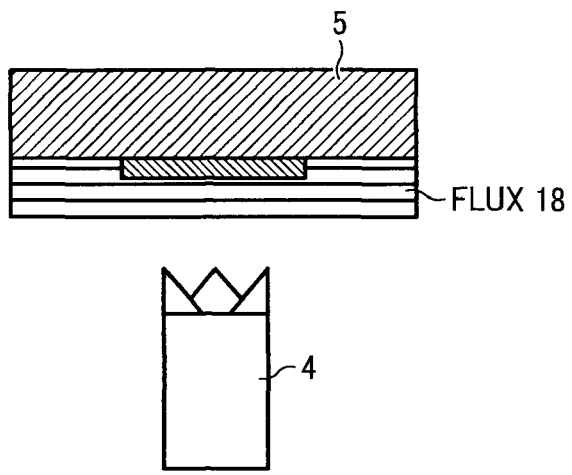
FIGS. 6A-6D illustrate removal of flux according to the embodiment of the present invention.
Figure 6B:
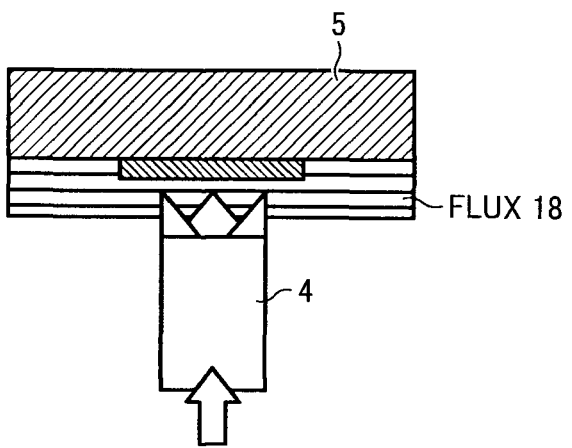
Figure 6C:
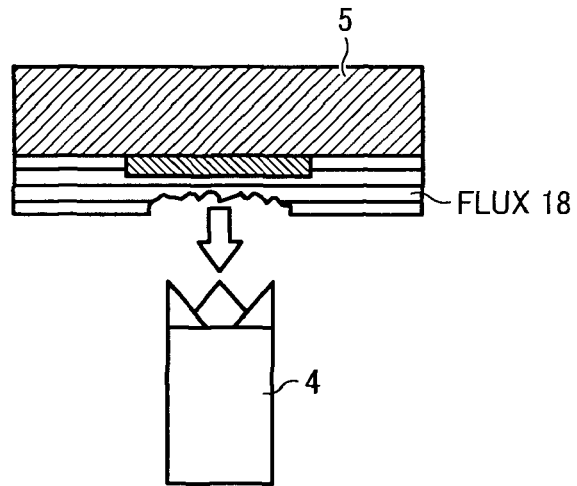
Figure 6D:
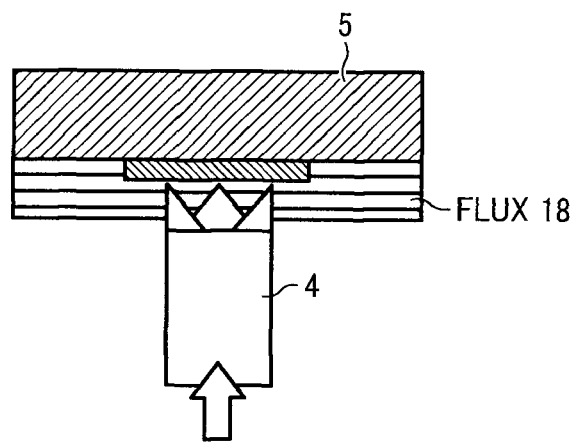

FIGS. 6A-6D are figures explaining the flux removal in steps (S7-A and S7-B) illustrated in FIG. 5. As illustrated in FIGS. 6A and 6B, the contact pins 4 are raised to an attached film of a flux 18 on the printed substrate 5, and then as illustrated in FIG. 6C, the contact pins 4 are lowered from the printed substrate 5. And further, the contact pins 4 are raised again, as illustrated in FIG. 6D, and the up-and-down motion of the contact pins 4 is repeated multiple times until the film of the flux 18 is reliably broken through.

Therefore, the flux of the printed substrate 5 is removed automatically and reliably, and the inspection is performed with a good electrical connection state.

A stepping motor or a DC motor or the like can be used as the motor 16 of the driving member 7. In a case that the stepping motor is used, the load increases when the contact pins 4 make contact with the object to be inspected and are forced in. In addition, as the motor driver 17, a PWM (pulse-duration modulation) driver can be used to perform a constant current control.

In addition, the number of times of the up-and-down motion of the contact pins 4, or the number of times of conduction (energization) corresponding to the up-and-down motion of the contact pins, or an NG incidence is counted by the control circuit 13 of the control member 8, the result obtained is arithmetically processed by the CPU 12, and when it reaches a predetermined value, as indicated by a luminescence display or a buzzer, for example, notification of the need for a replacement cycle of the contact pins 4 can be received.

FIG. 7 illustrates a flow chart according to operations of the present embodiment, and includes an operation for informing that the time for replacement of the contact pins is reached, and the operation flow is basically similar to that illustrated in FIG. 5.

There is a different point between the flow charts illustrated in FIG. 5 and FIG. 7, i.e., in the flow chart illustrated in FIG. 7, between step (S6) and steps (S7-A and S7-B) of the flow chart illustrated in FIG. 5, a step (S14) is set for monitoring whether the total number of times of the up-and-down motion of the contact pins 4 (total number of times of contacting with the printed substrate) exceeds a preset number of times (Nt times) or not in the CPU 12, and when it is determined that the preset number of times is exceeded, a signal for replacement is output, and the information that the time for replacement of the contact pins 4 is reached, for example, is luminescently displayed with a replacement indication lamp (S15) to inform an operator.

Figure 8:
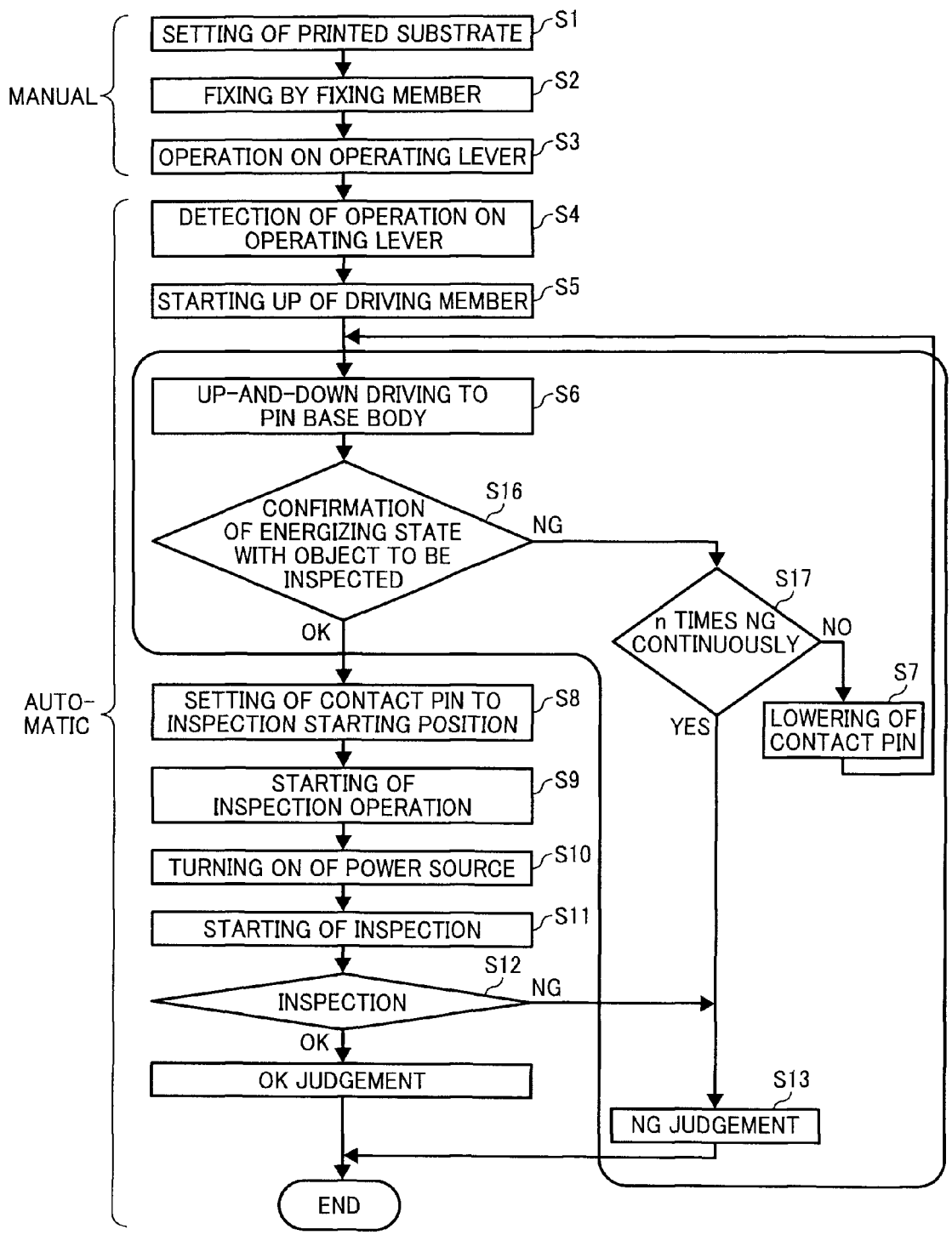
FIG. 8 is a flow chart illustrating another inspection process according to the embodiment of the present invention.

FIG. 8 illustrates a flow chart of another example of the inspection process according to the present embodiment. In the example illustrated in FIG. 8, the operation flow is basically similar to that illustrated in FIG. 5, while a flow following step S6 and step S7 is different to that illustrated in FIG. 5.

The different flow is explained as follows. As illustrated in FIG. 8, in step S6, the pin base body 3 is raised, and the contact pins 4 abut the printed substrate 5. At this time, whether it is in a proper energizing state or not is checked by the CPU 12 (S16). In step S7, the pin base body 3 is moved up and down for the preset number of times, while at this time, when it is determined that it is not in the energizing state even if the pin base body 3 has been moved up and down for the preset number of times, it is determined to be NG (S17) and the process is terminated without performing the inspection, by the control of the CPU 12.

Therefore, it can reduce the time required for the inspection and judgment by confirming a contact failure before entering the inspection flow. As a checking member which is configured to check a conduction/energizing state, the energizing state of the printed substrate 5 is judged with the CPU 12 by using the contact pins 4 in the above-mentioned examples, while it can use a check pin 19 for confirming the conduction, which will be explained later.

Figure 9:
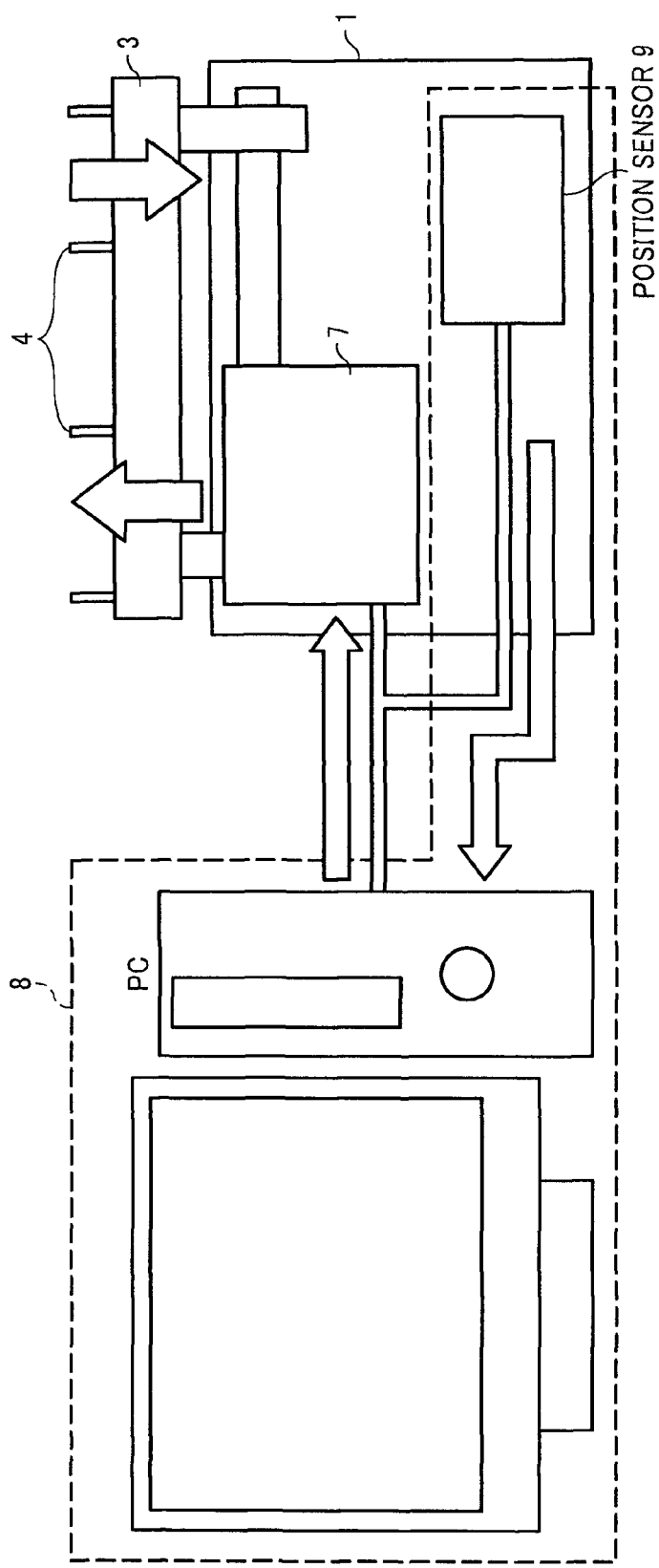
FIG. 9 illustrates a structure of an example in which a personal computer (PC) is used as a control member, according to the embodiment of the present invention.

FIG. 9 illustrates a structure of another example of the present embodiment in which a personal computer (PC) is used as the control member. In the following explanations, the same signs are used for members corresponding to the members that have been explained, and a detailed explanation is omitted.

As illustrated in FIG. 9, by employing an external PC, but not a single-chip CPU, as the control member 8, the inspection apparatus itself becomes inexpensive, and due to data confirmation and a common interface (I/F) of PC, a plurality of inspection apparatuses can be used by one PC.

Figure 10:
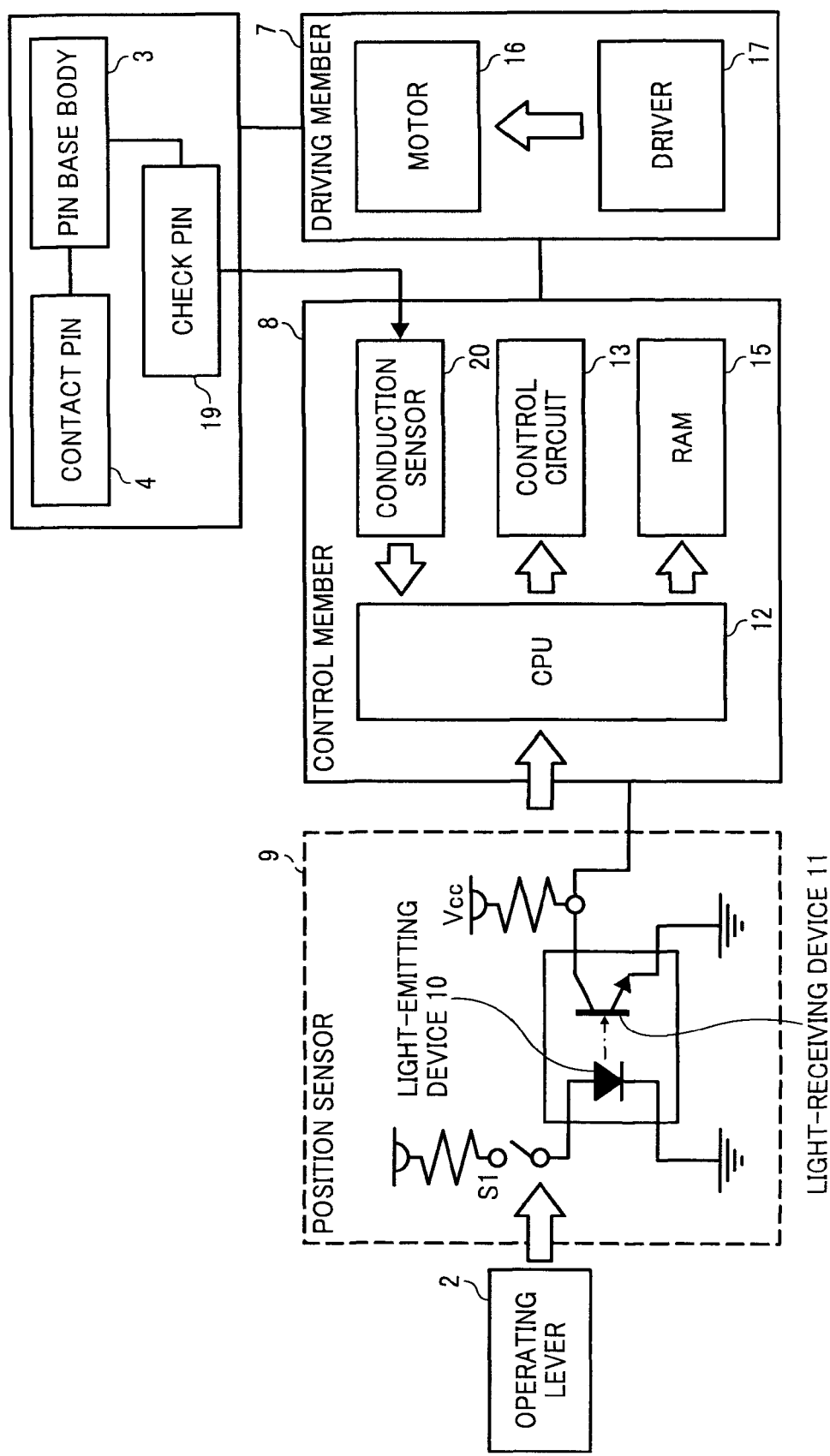
FIG. 10 illustrates a structure of an example in which a check pin is provided at a pin base body of the inspection apparatus, according to the embodiment of the present invention.

FIG. 10 illustrates an example of the inspection apparatus in which the check pin is provided to the pin base body, i.e. the check pin 19 which is configured to check the conduction of the printed substrate 5, for example, is provided to the pin base body 3.

In FIG. 10, the flux film is removed similarly, as above-mentioned. When the flux is removed and the check pin 19 is in the conduction state, the conduction state is detected by a conduction detection part 20 (a conduction sensor) of the control member 8. Therefore, when the CPU 12 receives the conduction detection signal, by setting the pin base body 3 to the inspection starting position and putting it into a state capable of inspecting, the electrical inspection on the printed substrate 5 can be carried out reliably.

Figure 11:
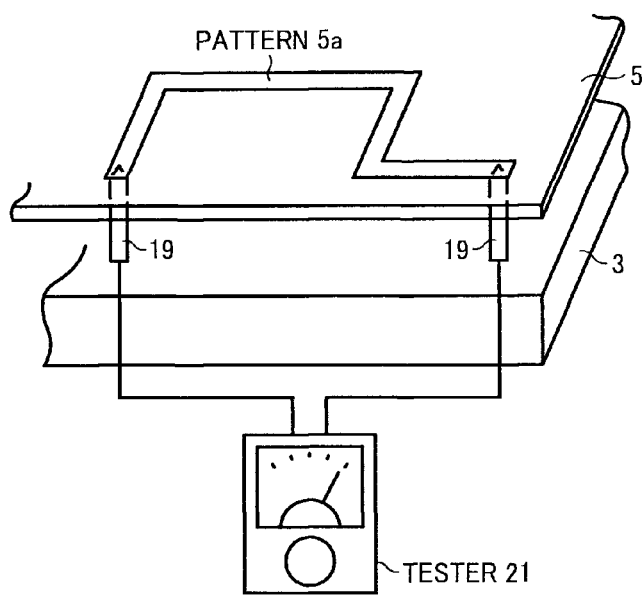
FIG. 11 illustrates a structure of an example of a conduction confirmation device by a check pin used for conduction confirmation, according to the embodiment of the present invention.

As illustrated in FIG. 11, as a device for confirming conductions of a pair of check pins 19 used for conduction confirmation with a pattern 5a of the printed substrate 5, a tester 21 is connected to the control member 8, or a tester function is built into the control member 8, and such a configuration is possible to be used, i.e. when a resistance between the pair of check pins 19 is equal to or lower than a preset resistance, it is determined that the pair of check pins 19 and the pattern 5a are electrically connected and conductive, and then the inspection is started.

Other possible methods for the conduction confirmation are as follows. For example:
(1) Applying a voltage to one check pin on the pattern, measuring a voltage level at the other check pin, and confirming the electrical connection by the voltage level obtained;
(2) Connecting a constant current source with one check pin which is connected to the pattern, connecting a current measurement instrument with the other check pin side, and confirming the electrical connection by a current level.

Figure 12:
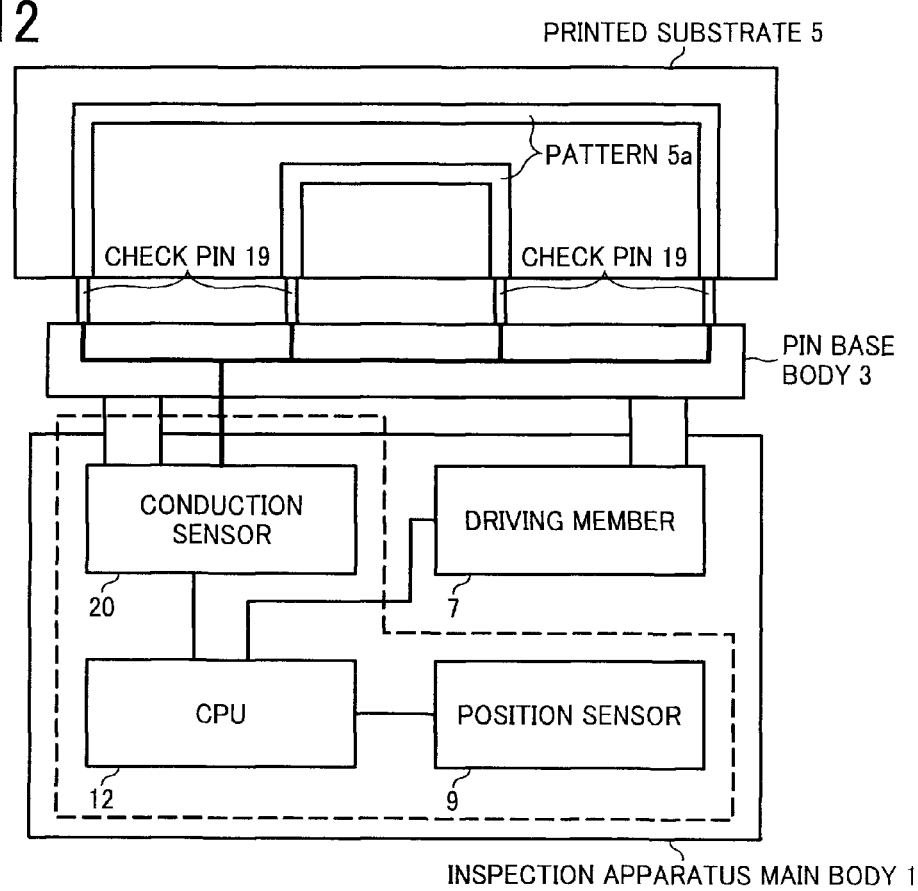
FIG. 12 illustrates an example of a pattern for conduction confirmation, according to the embodiment of the present invention.
Figure 13:
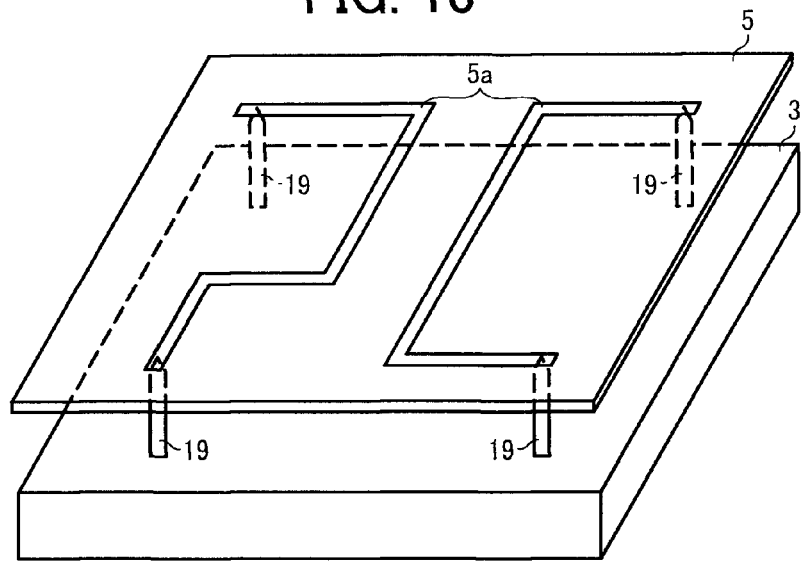
FIG. 13 illustrates another example of the pattern for conduction confirmation, according to the embodiment of the present invention.

The pattern 5a for the conduction confirmation is formed in an area of the printed substrate 5 where the check pins 19 come into contact with the printed substrate 5, as illustrated in FIGS. 12 and 13. In addition, as the pattern 5a for the conduction confirmation, it can put the check pin in touch with the power source pin formed on the printed substrate 5 directly, without forming a special pattern.

Figure 14:
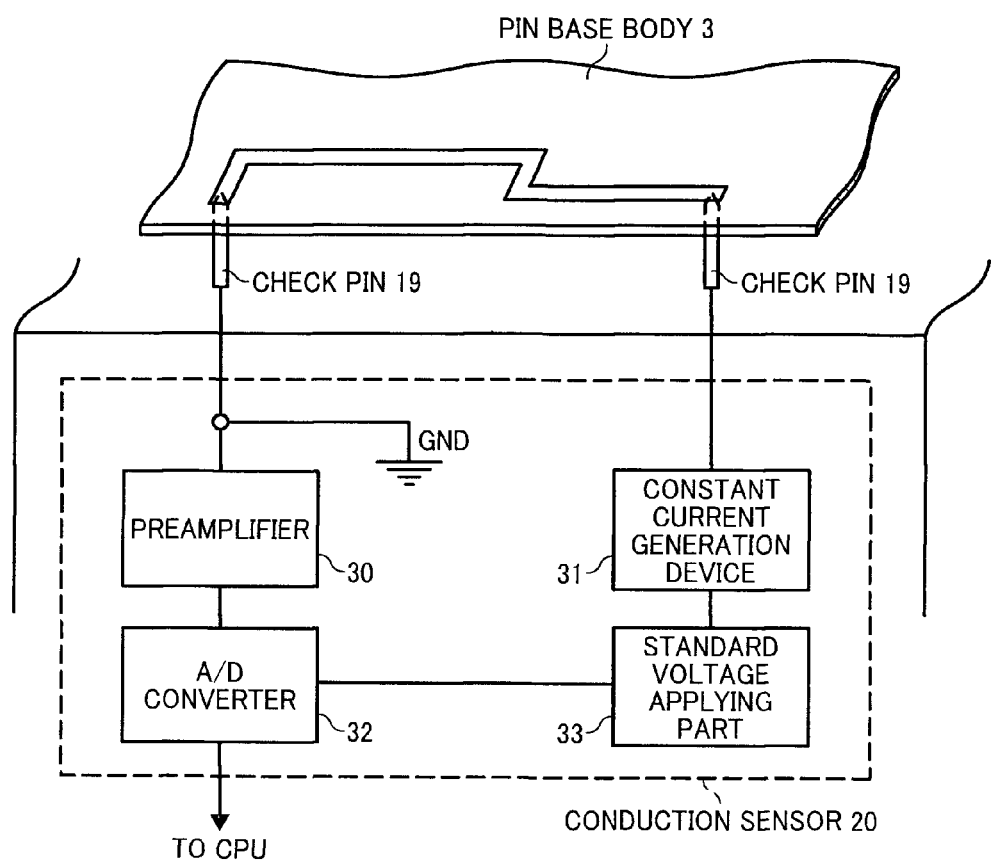
FIG. 14 is a block chart illustrating a structure of one example of a conduction sensor according to the embodiment of the present invention.

FIG. 14 is a block chart illustrating a structure of one example of the conduction sensor. The conduction sensor includes a preamplifier 30 connected to the one check pin 19, a constant current generation device 31 connected to the other check pin 19, an A/D converter 32 connected to the preamplifier 30, and a standard voltage applying part 33 connected to the constant current generation device 31 and the A/D converter 32.

In the conduction sensor 20 illustrated in FIG. 14, a predetermined current flows through the check pins 19, a resistance is obtained from a voltage generated in this part, and then the resistance obtained is analog/digital converted by the A/D converter 32, and is output to the CPU 12, and the energizing state is judged.

Figure 15A:
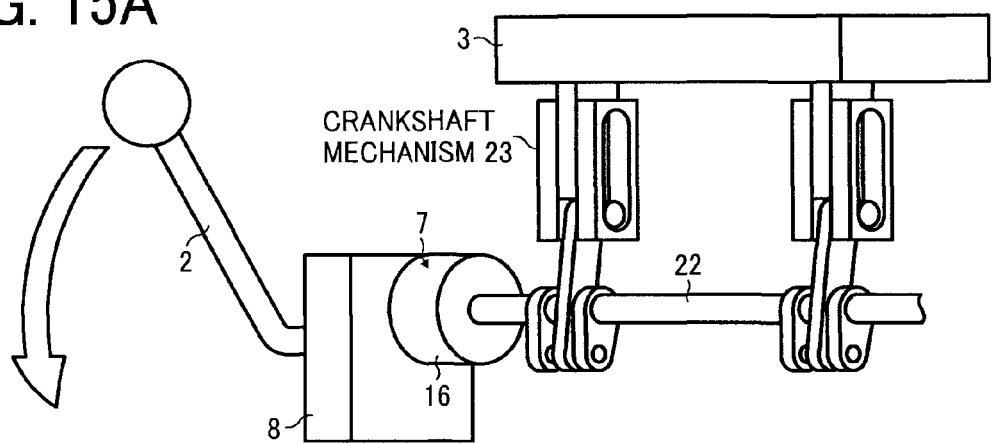
FIGS. 15A-15C are perspective views illustrating a structure and operations of a first example of a driving member according to the embodiment of the present invention.
Figure 15B:
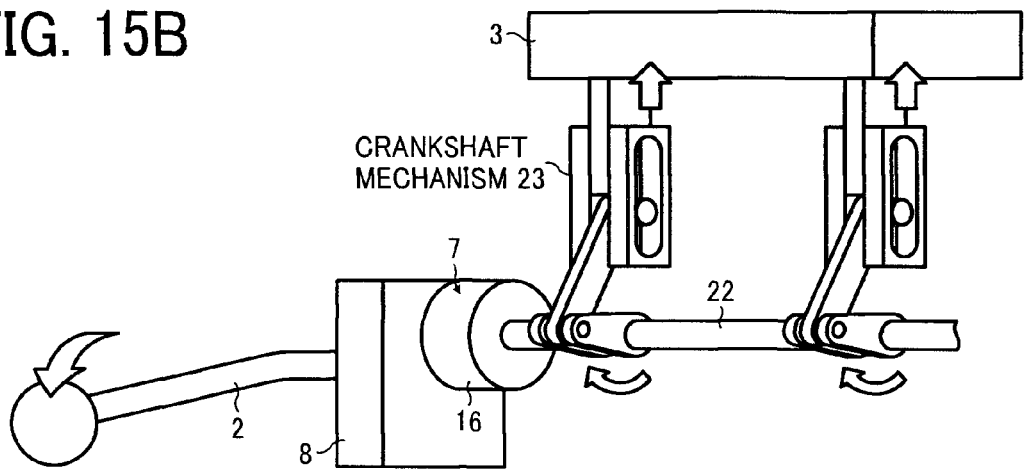
Figure 15C:
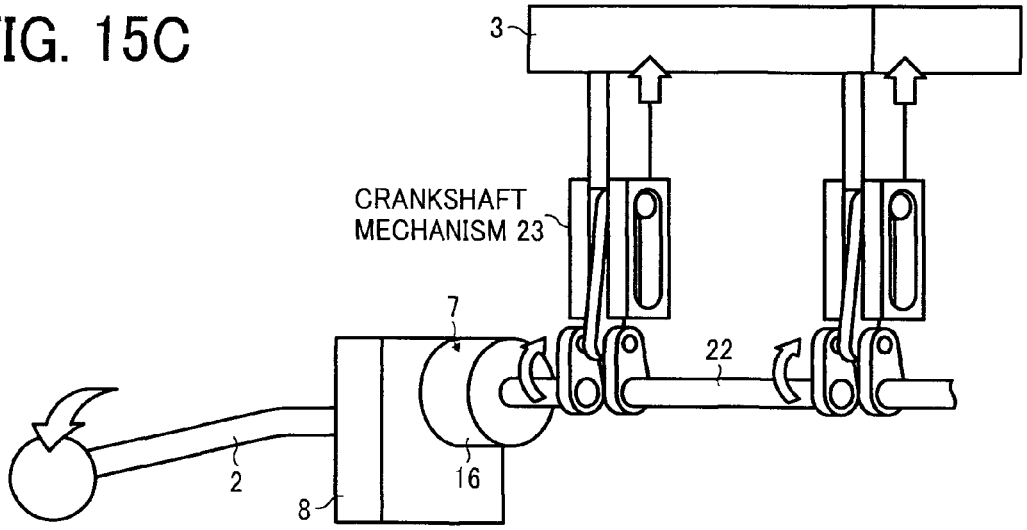

FIGS. 15A-15C are perspective views illustrating a structure and operations of a first example of the driving member of the present embodiment. FIG. 15A illustrates a standby state, FIG. 15B illustrates a state when rising, and FIG. 15C illustrates a state when inspecting.

In the first example, one end part of a crankshaft mechanism 23 is connected to a rotary shaft 22 which is rotary driven by the motor, and another end part of the crankshaft mechanism 23 is provided at the pin base body 3.

A signal is output to the CPU 12 of the control member 8 when the operating lever 2 is operated by the operator, and a driving signal is sent from the CPU 12 to the motor 16 of the driving member 7, and the motor 16 is started up based on this signal and the rotary shaft 22 is rotated. A rotary movement of the rotary shaft 22 is converted to an up-and-down movement by the crankshaft mechanism 23, and the pin base body 3 is driven up and down.

Therefore, by electrical control of the pin base body 3 with the CPU 12, it can vary an up-and-down motion frequency of the pin base body 3 and an operation speed readily, and thus it can correspond to various demands and specifications readily.

Figure 16A:
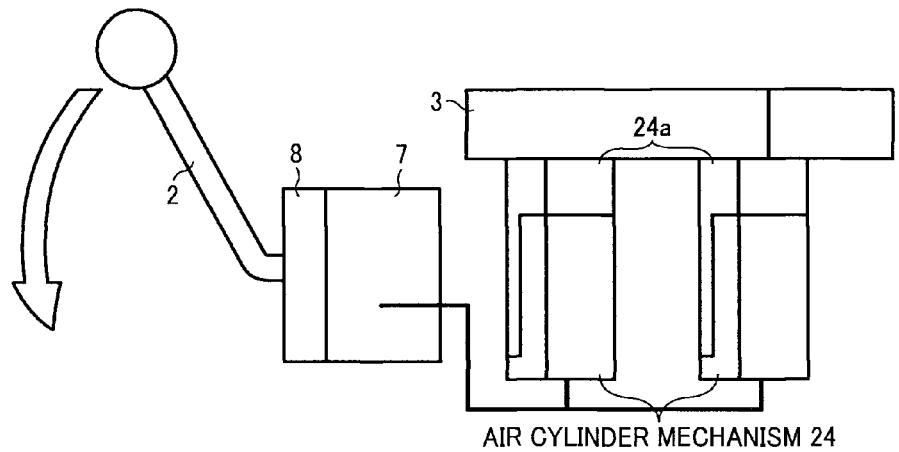
FIGS. 16A-16C are perspective views illustrating a structure and operations of a second example of the driving member according to the embodiment of the present invention.
Figure 16B:
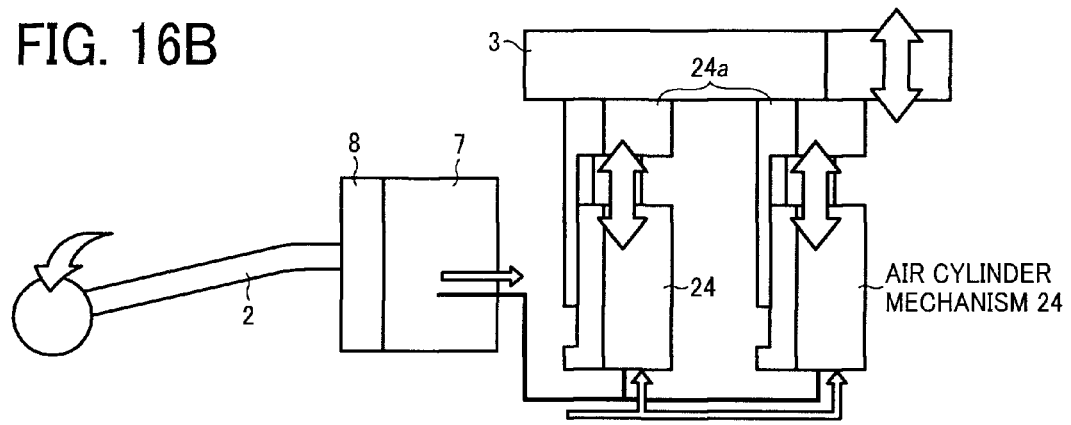
Figure 16C:
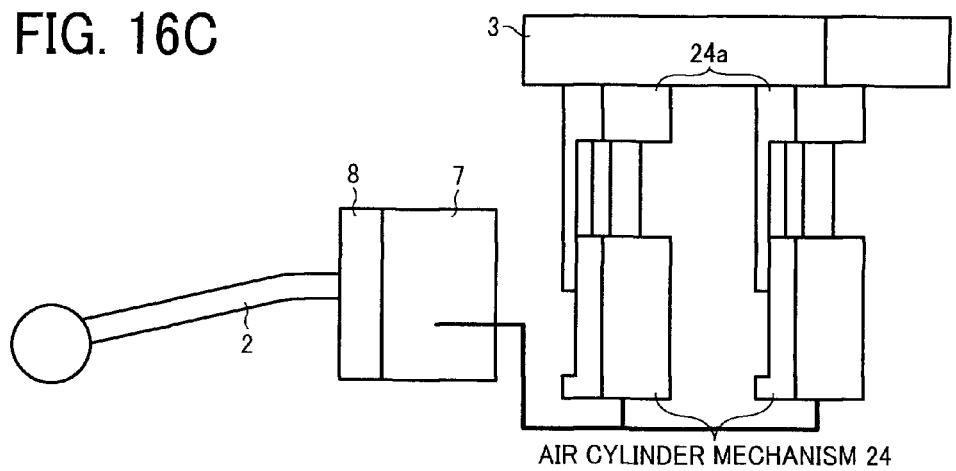

FIGS. 16A-16C are perspective views illustrating a structure and operations of a second example of the driving member of the present embodiment. FIG. 16A illustrates a standby state, FIG. 16B illustrates a state when rising, and FIG. 16C illustrates a state when inspecting.

In the second example, an air cylinder mechanism 24 driven by an air controller (not illustrated) of the driving member 7 is provided between the pin base body 3 and the control member 8.

A signal is output to the CPU 12 of the control member 8 when the operating lever 2 is operated by the operator, and a driving signal is sent from the CPU 12 to the air controller of the driving member 7, and the air cylinder mechanism 24 is started up based on this signal, and then a moving part 24a of the air cylinder mechanism 24 moves up and down to drive the pin base body 3 to move up and down.

Therefore, by electrical control of the pin base body 3 with the CPU 12, similar to the above-mentioned example, and by using the air cylinder mechanism 24, it can vary an up-and-down motion frequency of the pin base body 3, a stroke, a pin load, and an operation speed readily, and thus it can correspond to various demands and specifications readily.

Figure 17A:
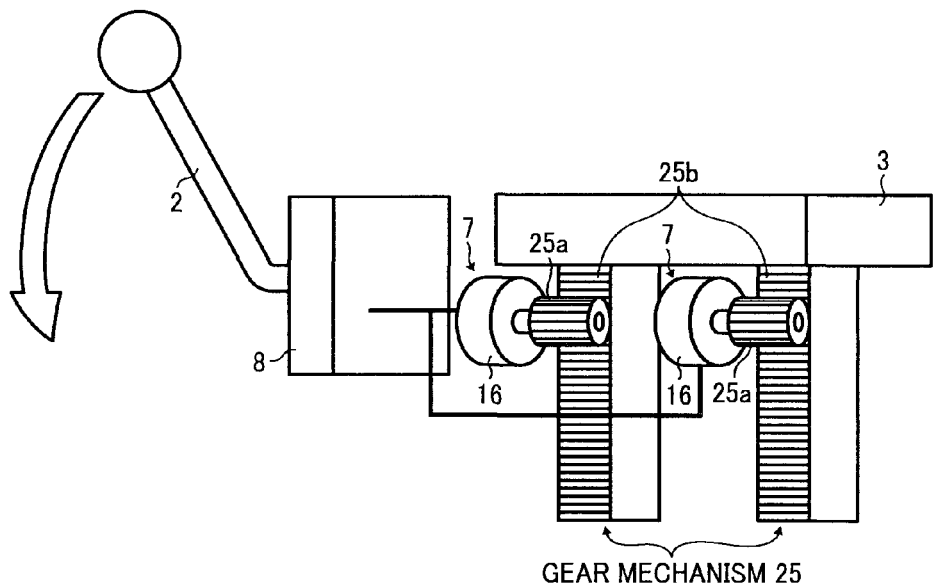
FIGS. 17A-17C are perspective views illustrating a structure and operations of a third example of the driving member according to the embodiment of the present invention.
Figure 17B:
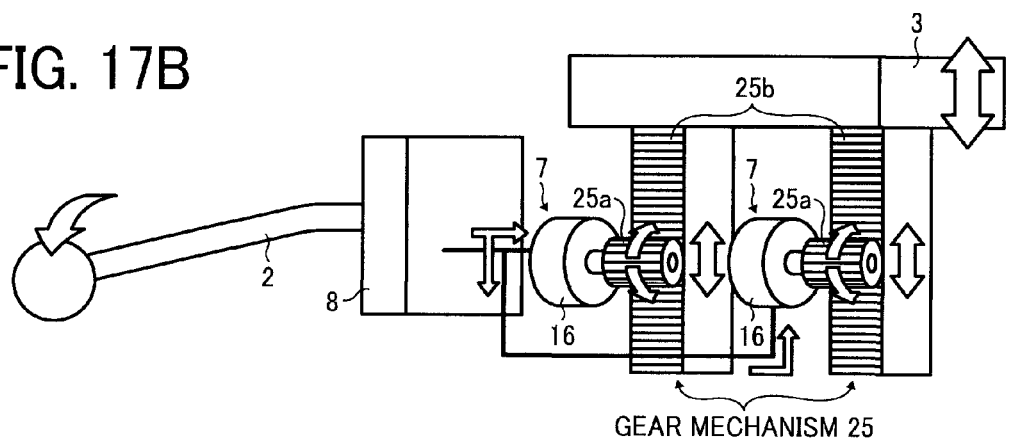
Figure 17C:
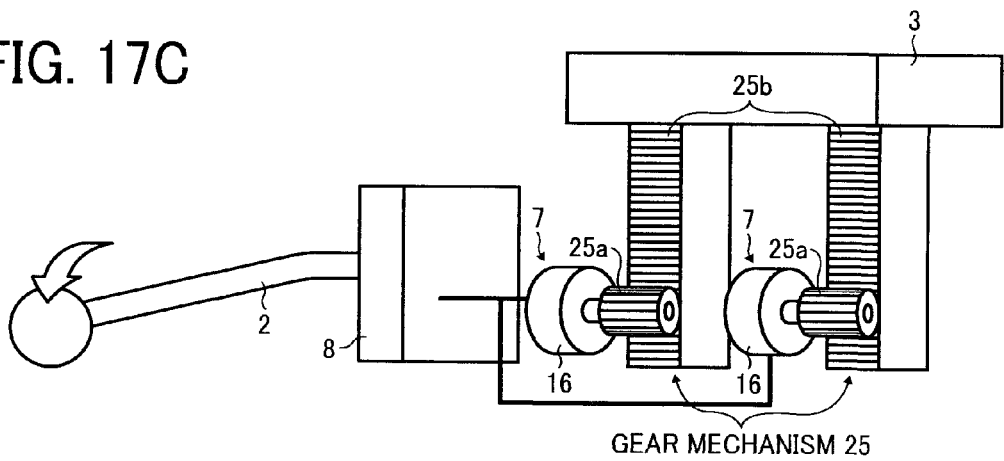

FIGS. 17A-17C are perspective views illustrating a structure and operations of a third example of the driving member of the present embodiment. FIG. 17A illustrates a standby state, FIG. 17B illustrates a state when rising, and FIG. 17C illustrates a state when inspecting.

In the third example, a gear mechanism 25 including a pinion 25a and a rack 25b of the driving member 7 is provided at the pin base body 3. A rotary drive force of the motor is transferred to the gear mechanism 25 by such as a gear or a belt (not illustrated) of the driving member 7.

A signal is output to the CPU 12 of the control member 8 when the operating lever 2 is operated by the operator, and a driving signal is sent from the CPU 12 to the driving member 7, and the motor 16 is started up based on this signal, and then the pinion 25a is rotary driven, thus the pin base body 3 is driven to move up and down by an up-and-down movement of the rack 25b.

Therefore, by electrical control of the pin base body 3 with the CPU 12, similar to the above-mentioned example, and by using the gear mechanism 25, it can vary an up-and-down motion frequency of the pin base body 3, a stroke, a pin load, and an operation speed readily, and thus it can correspond to various demands and specifications readily.

Figure 18A:
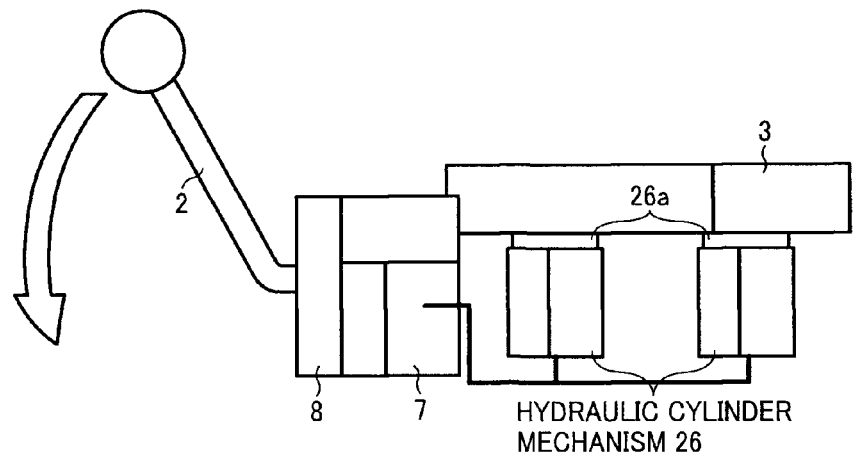
FIGS. 18A-18C are perspective views illustrating a structure and operations of a fourth example of the driving member according to the embodiment of the present invention.
Figure 18B:
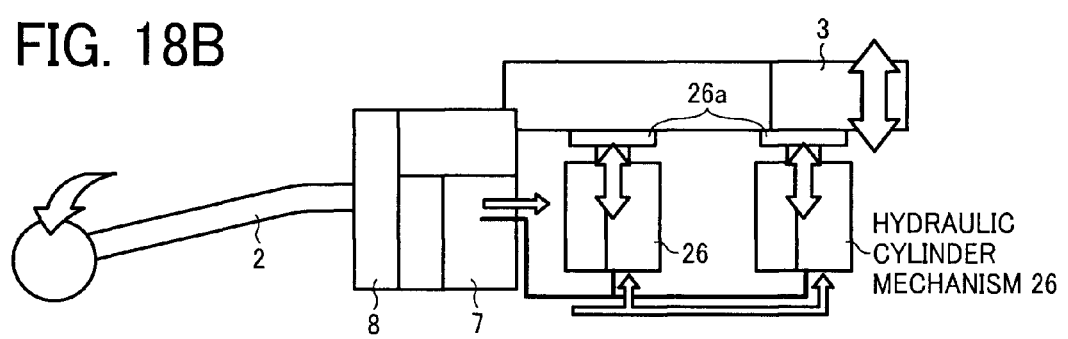
Figure 18C:
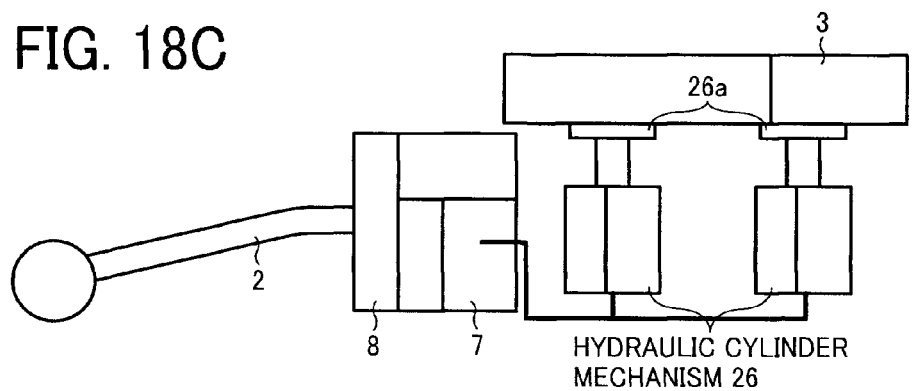

FIGS. 18A-18C are perspective views illustrating a structure and operations of a fourth example of the driving member of the present embodiment. FIG. 18A illustrates a standby state, FIG. 18B illustrates a state when rising, and FIG. 18C illustrates a state when inspecting.

In the fourth example, a hydraulic cylinder mechanism 26 driven by a hydraulic controller (not illustrated) of the driving member 7 is provided between the pin base body 3 and the control member 8.

A signal is output to the CPU 12 of the control member 8 when the operating lever 2 is operated by the operator, and a driving signal is sent from the CPU 12 to the hydraulic controller of the driving member 7, and the hydraulic cylinder mechanism 26 is started up based on this signal, and then a moving part 26a of the hydraulic cylinder mechanism 26 moves up and down to drive the pin base body 3 to move up and down.

Therefore, by electrical control of the pin base body 3 with the CPU 12, similar to the above-mentioned example, and by using the hydraulic cylinder mechanism 26, it can vary an up-and-down motion frequency of the pin base body 3, a stroke, a pin load, and an operation speed readily, and thus it can correspond to various demands and specifications readily.

Figure 19A:
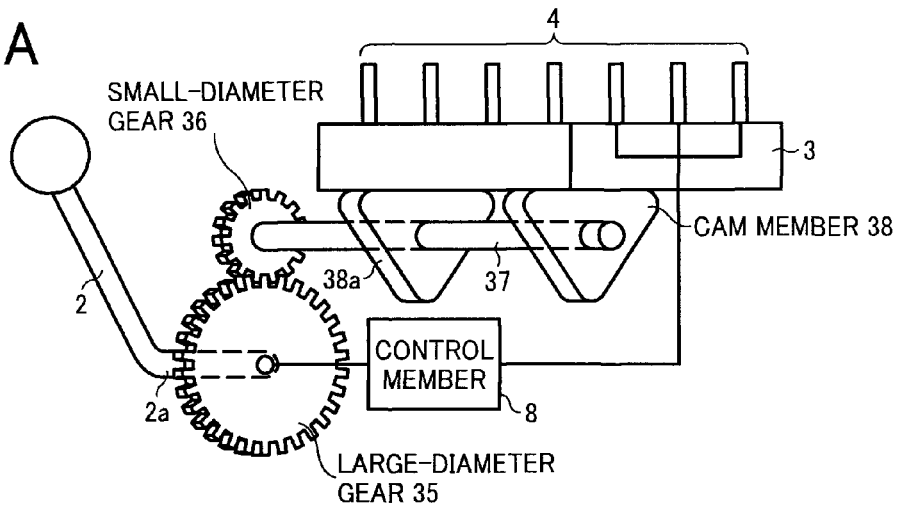
FIGS. 19A-19C are perspective views illustrating a structure and operations of a fifth example of the driving member according to the embodiment of the present invention.
Figure 19B:
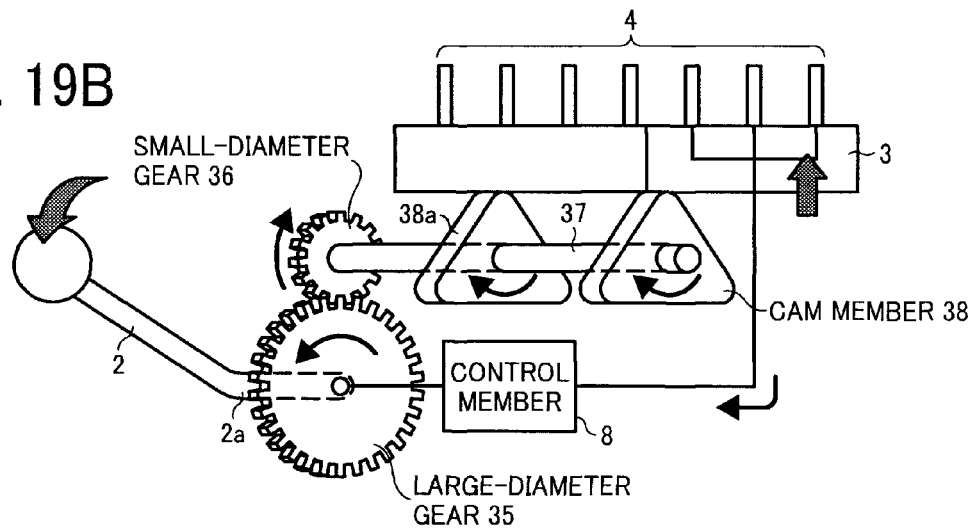
Figure 19C:
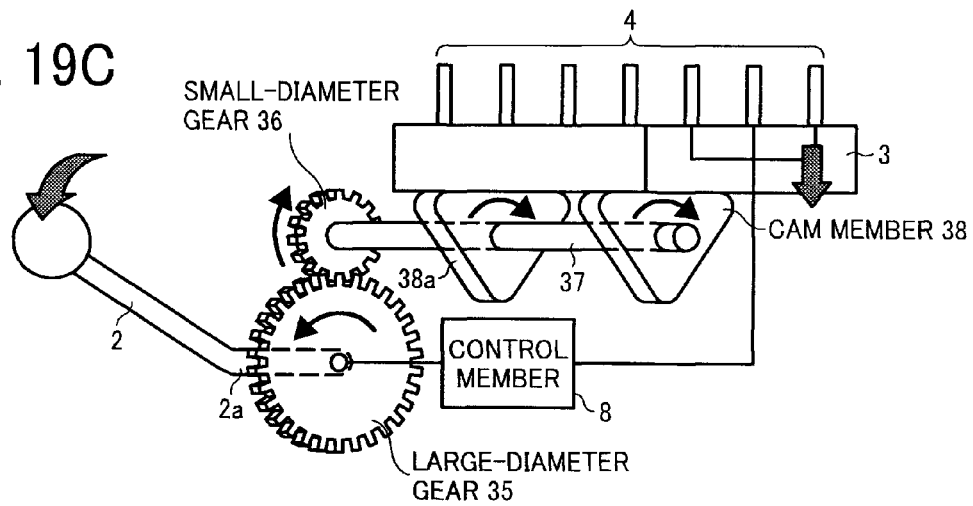

FIGS. 19A-19C are perspective views illustrating a structure and operations of a fifth example of the driving member of the present embodiment. FIG. 19A illustrates a standby state, FIG. 19B illustrates a state when rising (when inspecting), and FIG. 19C illustrates a state when moving down.

In the fifth example, a large-diameter gear 35 is fixed to a rotary shaft 2a which extends from an end part of the operating lever 2, and a plurality of polygonal shaped (triangular ones in the figures) cam members 38 are provided at a rotary shaft 37, the rotary shaft 37 extending from a center of a small-diameter gear 36 which engages with the large-diameter gear 35. In the present example, two cam members 38 are employed. A cam face 38a of each of the plurality of cam members 38 is brought into contact with a lower surface of the pin base body 3, and the pin base body 3 is driven to move up and down based on a contact surface of the cam face 38a being a convex surface or a flat surface.

When the operating lever 2 is operated to rotate by the operator, the small-diameter gear 36 receives a rotation of the large-diameter gear 35 and rotates one or more than one turn (can be set with gear ratio), while the operating lever 2 rotates by a predetermined angle in one stroke, and the cam members 38 rotate together with the rotation of the small-diameter gear 36, and thus the pin base body 3 is driven to move up and down.

An angle of rotation of the large-diameter gear 35, and an electrical detection of the contact pins 4 of the pin base body 3 are detected with the various detection members mentioned above, and sensing signals are output to the CPU 12 of the control member 8, and the operation controls of the above-mentioned flow chart are performed.

Therefore, it can drive the pin base body 3 to move up and down by a relatively simple mechanism, during a one-stroke operation of the operating lever 2, without employing an electrical control device.

Figure 20A:
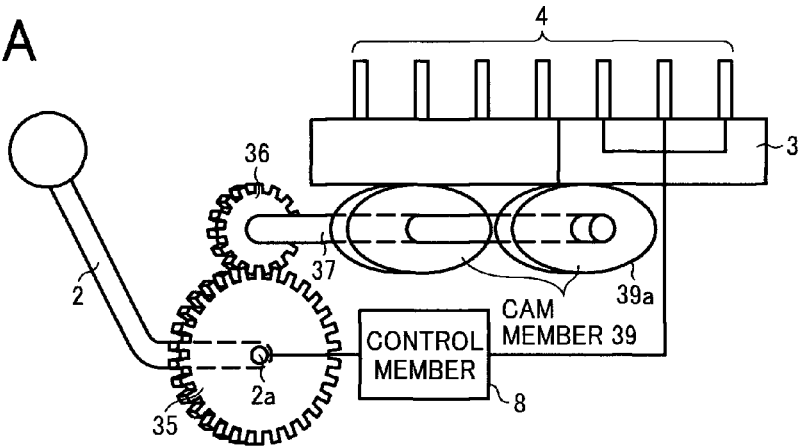
FIGS. 20A-20C are perspective views illustrating a structure and operations of a sixth example of the driving member according to the embodiment of the present invention.
Figure 20B:
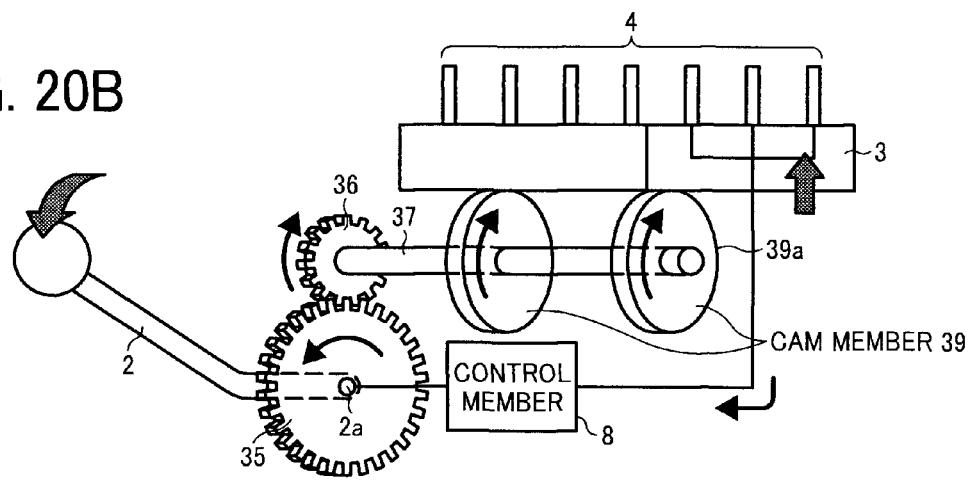
Figure 20C:
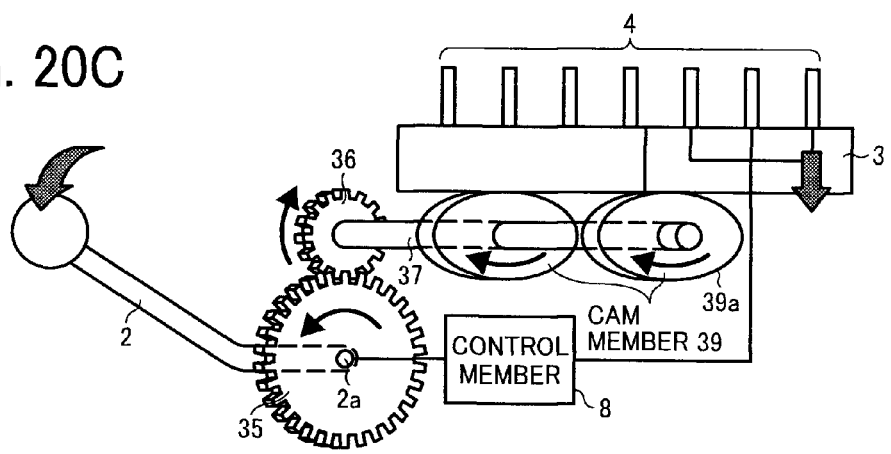

FIGS. 20A-20C are perspective views illustrating a structure and operations of a sixth example of the driving member of the present embodiment. FIG. 20A illustrates a standby state, FIG. 20B illustrates a state when rising (when inspecting), and FIG. 20C illustrates a state when moving down.

In the sixth example, the large-diameter gear 35 is fixed to the rotary shaft 2a, which extends from the end part of the operating lever 2, and a plurality of elliptical shaped cam members 39 are provided at the rotary shaft 37, the rotary shaft 37 extending from the center of the small-diameter gear 36 which engages with the large-diameter gear 35. In the present example, two elliptical shaped cam members 39 are employed. A cam face 39a of each of the plurality of cam members 39 is brought into contact with the lower surface of the pin base body 3, and the pin base body 3 is driven to move up and down based on a contact surface of the cam face 39a being a large-diameter part or a small-diameter part.

When the operating lever 2 is operated to rotate by the operator, the small-diameter gear 36 receives a rotation of the large-diameter gear 35 and rotates one or more than one turn (can be set with gear ratio), while the operating lever 2 rotates by a predetermined angle in one stroke, and the cam members 39 rotate together with the rotation of the small-diameter gear 36, and thus the pin base body 3 is driven to move up and down.

An angle of rotation of the large-diameter gear 35, and an electrical detection of the contact pins 4 of the pin base body 3 are detected with the various detection members, similar to the above-mentioned examples, and sensing signals are output to the CPU 12 of the control member 8, and the operation controls of the above-mentioned flow chart are performed.

Therefore, it can drive the pin base body 3 to move up and down by a relatively simple mechanism, during a one-stroke operation of the operating lever 2, without employing an electrical control device. In addition, the pin base body 3 moves up and down gradually due to each of the plurality of cam members being in the elliptical shape, therefore it can reduce the probability of damage to the object to be inspected.

Figure 21A:
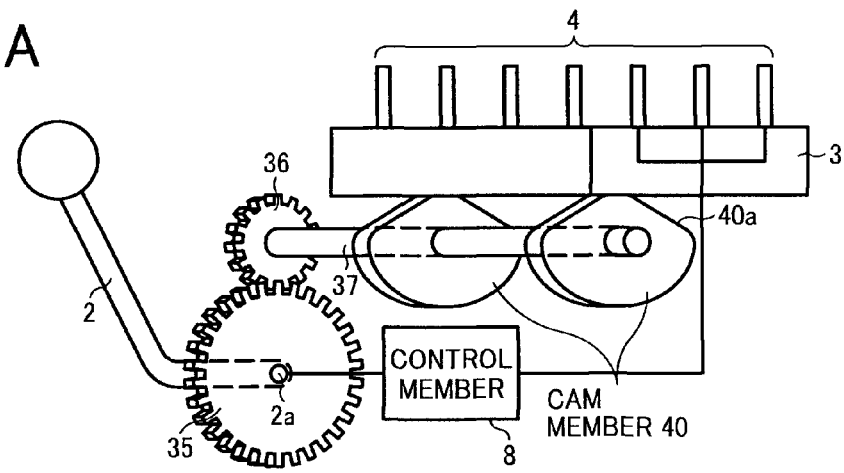
FIGS. 21A-21C are perspective views illustrating a structure and operations of a seventh example of the driving member according to the embodiment of the present invention.
Figure 21B:
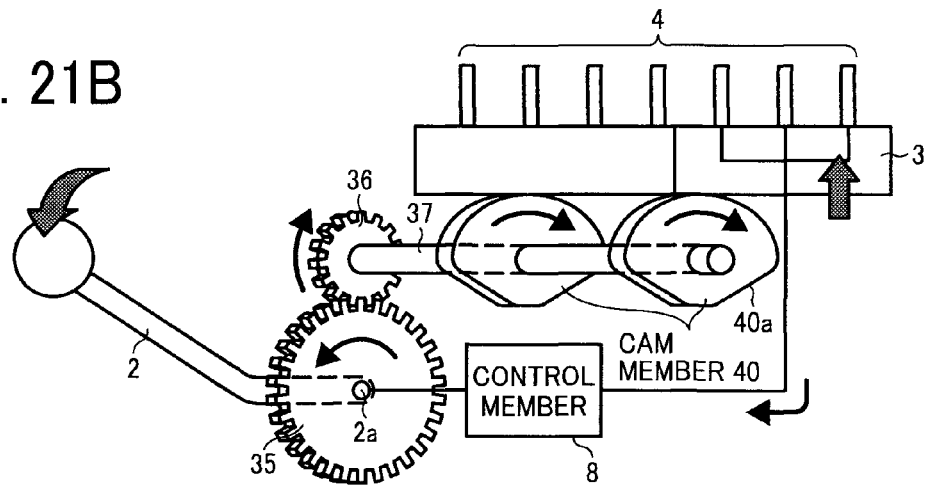
Figure 21C:
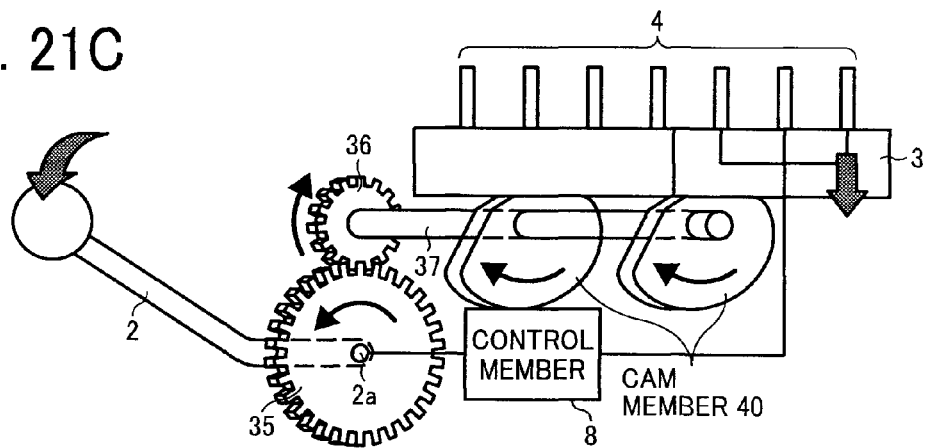
Figure 22:
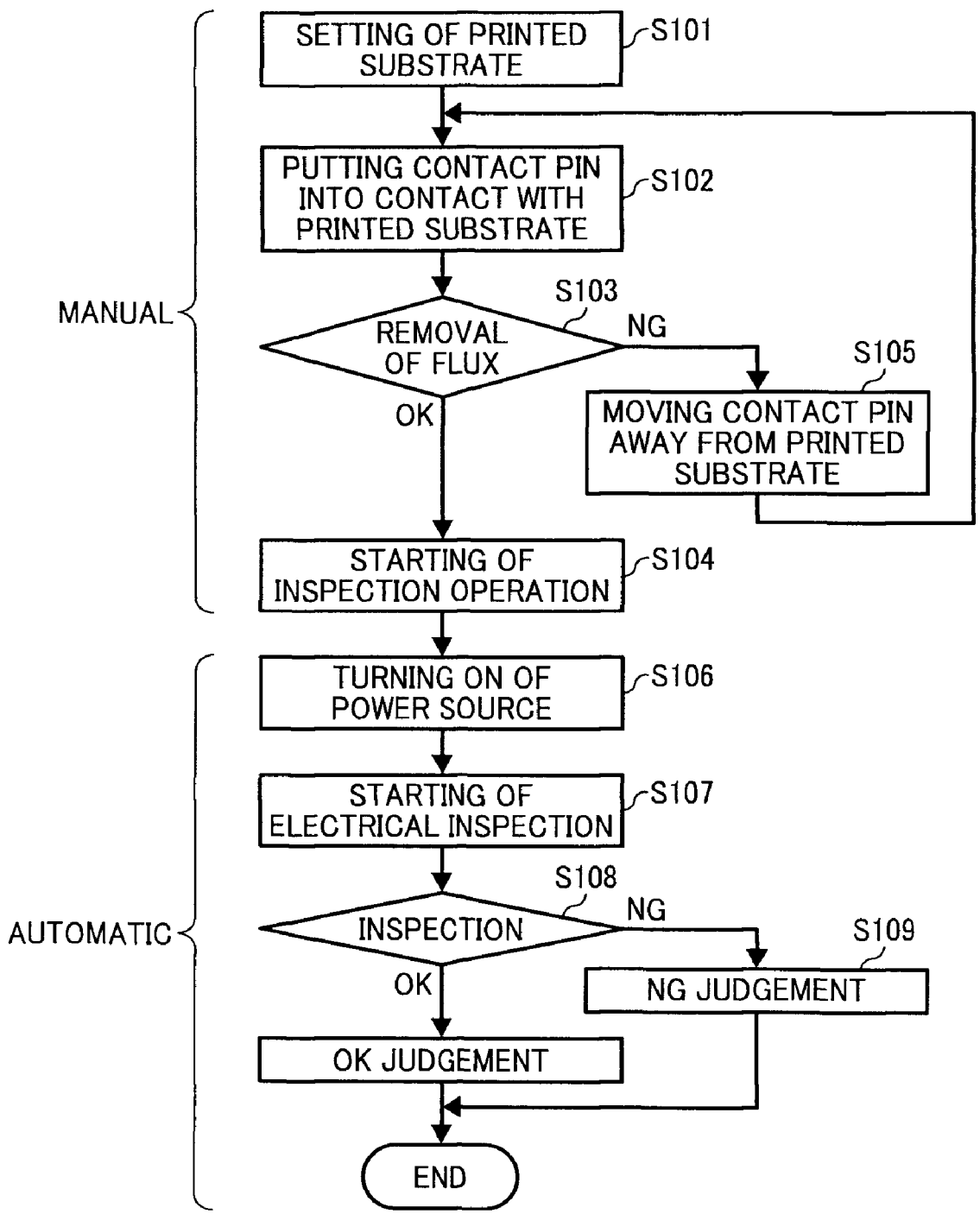
FIG. 22 is a flow chart illustrating a conventional inspection process.

FIGS. 21A-21C are perspective views illustrating a structure and operations of a seventh example of the driving member of the present embodiment. FIG. 21A illustrates a standby state, FIG. 21B illustrates a state when rising (when inspecting), and FIG. 21C illustrates a state when moving down.

In the seventh example, the large-diameter gear 35 is fixed to the rotary shaft 2a, which extends from the end part of the operating lever 2, and a plurality of cam members 40 are provided at the rotary shaft 37, the rotary shaft 37 extending from the center of the small-diameter gear 36 which engages with the large-diameter gear 35. In the present example, a part of each of the cam members 40 has a circular shape (fan shape in the figures), and two cam members 40 are employed. A cam face 40a of each of the plurality of cam members 40 is brought into contact with the lower surface of the pin base body 3, and the pin base body 3 is driven to move up and down based on a contact surface of the cam face 40a being a circular shape part or a noncircular shape part.

When the operating lever 2 is operated to rotate by the operator, the small-diameter gear 36 receives a rotation of the large-diameter gear 35 and rotates one or more than one turn (can be set with gear ratio), while the operating lever 2 rotates by a predetermined angle in one stroke, and the cam members 40 rotate together with the rotation of the small-diameter gear 36, and thus the pin base body 3 is driven to move up and down.

An angle of rotation of the large-diameter gear 35, and an electrical detection of the contact pins 4 of the pin base body 3 are detected with the various detection members, similar to the above-mentioned examples, and sensing signals are output to the CPU 12 of the control member 8, and the operation controls of the above-mentioned flow chart are performed.

Therefore, it can drive the pin base body 3 to move up and down by a relatively simple mechanism, during one stroke operation of the operating lever 2, without employing an electrical control device. In addition, due to each of the plurality of cam members 40 being in the fan shape, the pin base body 3 is kept at an upper level position for a comparatively long time, therefore the flux of the printed substrate 5 is reliably removed, and the inspection can be carried out in an excellent electrical connection state.

According to a preferable embodiment of the present invention, an inspection is carried out after flux being removed completely, therefore, it can perform a reliable and efficient inspection.

According to another preferable embodiment of the present invention, an inspection is carried out after flux is removed and a confirmation of the energizing state of an object to be inspected is made, therefore, it can perform a reliable and efficient inspection.

According to a further preferable embodiment of the present invention, it can remove flux and carry out an electrical conduction check automatically and reliably.

According to a further preferable embodiment of the present invention, removal of flux and an electrical conduction check are performed with the same member, therefore it can reduce the number of components.

According to a further preferable embodiment of the present invention, it can reduce the time required for judgment of failure.

According to a further preferable embodiment of the present invention, it can reduce the time required for judgment of member replacement.

According to the present invention, in an inspection apparatus, when starting an inspection, an electrical connection member which removes flux attached to a part to be inspected of an object to be inspected is controlled by a control member to perform a plurality of removal operations of the flux on the part to be inspected of the object to be inspected automatically, and after that, the inspection is carried out. Therefore, it can eliminate wasting time taken at a previous stage for an electrical inspection of the object to be inspected, as in the conventional operations, and a reliable and efficient inspection can be achieved.

The present invention can be applied to an inspection apparatus in which flux attached to a part to be inspected of an object to be inspected is removed by putting a detection member into contact with the part to be inspected and then an inspection is performed on the object to be inspected. In particular, the present invention is effective for an inspection apparatus which uses an inspection contact pin for an electrical inspection of a printed substrate.

It should be noted that although the present invention has been described with respect to exemplary embodiments, the invention is not limited thereto. In view of the foregoing, it is intended that the present invention cover modifications and variations provided they fall within the scope of the following claims and their equivalent.

The entire contents of Japanese patent applications No. JP 2007-316967 filed on Dec. 7, 2007, and JP 2008-186863 filed on Jul. 18, 2008, of which the convention priorities are claimed in this application, are incorporated hereinto by reference.

What is claimed is:

1. An inspection apparatus which performs an electrical inspection of an object to be inspected, said inspection apparatus comprising:
   a main body;
   a fixing member provided at an upper part of the main body and which is configured to fix the object to be inspected to a predetermined inspection position on or in the inspection apparatus;
   a base member disposed downward of the fixing member and which is movable up and down, the base member having an upper face;
   an electrical connection member arranged at the upper face of the base member and configured to perform the electrical inspection on a part to be inspected of the object to be inspected;
   a driving member configured to reciprocately move the base member in an upward direction and a downward direction;
   a control member configured to control an operation of the driving member;
   an inspection start-up member arranged at a side part of the main body of the inspection apparatus, the inspection start-up member being turnable and configured for user operation; and
   a detector arranged in the main body and which includes a position detecting device, the detector being configured to detect the user operation of the inspection start-up member and send an operation start signal to the control member,
   wherein when the inspection start-up member is turned, after the object to be inspected is fixed to the predetermined inspection position by the fixing member, the operation of the inspection start-up member is detected by the position detecting device of the detector, and
   the detector sends the operation start signal to the control member, the control member drives the driving member to reciprocately move the base member in the upward direction and the downward direction and bring the electrical connection member, which is arranged at the base member, into contact with the part to be inspected of the object to be inspected a predetermined number of times and remove flux attached to the part to be inspected of the object to be inspected, and then the control member starts the electrical inspection on the part to be inspected by the electrical connection member.

2. An inspection apparatus according to claim 1, wherein the base member is provided with a plurality of the electrical connection members.

3. An inspection apparatus according to claim 1, wherein after a conduction confirmation of the object to be inspected is made by the control member, the control member starts the electrical inspection by the electrical connection member to start the inspection on the part to be inspected of the object to be inspected.

4. An inspection apparatus according to claim 1, wherein the base member is provided with a checking member which is configured to perform a conduction confirmation of the object to be inspected.

5. An inspection apparatus according to claim 4, wherein the checking member is the electrical connection member.

6. An inspection apparatus according to claim 1, wherein the control member makes an NG judgment when an energizing state is not confirmed, after putting the electrical connection member into contact with the part to be inspected of the object to be inspected the predetermined number of times.

7. An inspection apparatus according to claim 1, wherein the control member is configured to count a total number of times of the electrical connection member contacting with the part to be inspected of the object to be inspected, and output an annunciation signal for replacement of the electrical connection member when the total number of times obtained exceeds a preset number of times.

8. An inspection apparatus according to claim 1, wherein a crank mechanism is used as the driving member.

9. An inspection apparatus according to claim 1, wherein a gear mechanism is used as the driving member.

10. An inspection apparatus according to claim 1, wherein an air cylinder mechanism is used as the driving member.

11. An inspection apparatus according to claim 1, wherein a hydraulic cylinder mechanism is used as the driving member.

12. The inspection apparatus according to claim 1, wherein the inspection start-up member includes a turnable lever configured to be rotated in a predetermined direction.

13. The inspection apparatus according to claim 1, wherein the position detecting device monitors the operating condition of the turnable inspection start-up member, and the detector sends the operation start signal to the control member if an initial rotation of the turnable inspection start-up member is detected by the position detecting device.

14. The inspection apparatus according to claim 1, wherein the position detecting device includes a light-emitting device and a light-receiving device arranged adjacent to the inspection start-up member, and the light-emitting device and the light-receiving device performs light interception/transmission detection to thereby detect an initial rotation of the inspection start-up member.

15. The inspection apparatus according to claim 1, wherein the control member causes the driving member to reciprocately move the base member in the upward direction and the downward direction the predetermined number of times, after the operation of the turnable inspection start-up member is detected by the position detecting device of the detector.

16. The inspection apparatus according to claim 1, wherein the control member causes the driving member to reciprocately move the base member in the upward direction and the downward direction the predetermined number of times, after an initial rotation of the turnable inspection start-up member is detected by the position detecting device of the detector.

17. The inspection apparatus according to claim 1, wherein the control member causes the driving member to repeatedly move the base member in the upward direction and the downward direction for the predetermined number of times.

* * * * *